United States Patent
Huang et al.

(10) Patent No.: US 11,734,320 B2
(45) Date of Patent: Aug. 22, 2023

(54) LOG PROCESSING DEVICE AND LOG PROCESSING METHOD

(71) Applicant: INSTITUTE FOR INFORMATION INDUSTRY, Taipei (TW)

(72) Inventors: Yen-Wen Huang, Taipei (TW); Wei-Chao Hsu, Taipei (TW)

(73) Assignee: INSTITUTE FOR INFORMATION INDUSTRY, Taipei (TW)

(*) Notice: Subject to any disclaimer, the term of this patent is extended or adjusted under 35 U.S.C. 154(b) by 193 days.

(21) Appl. No.: 17/100,934

(22) Filed: Nov. 22, 2020

(65) Prior Publication Data

US 2022/0121693 A1 Apr. 21, 2022

(30) Foreign Application Priority Data

Oct. 19, 2020 (TW) ................. 109136181

(51) Int. Cl.
| | | |
|---|---|---|
| *G06F 16/215* | (2019.01) | |
| *G06F 16/248* | (2019.01) | |
| *G06F 16/332* | (2019.01) | |
| *G06F 16/335* | (2019.01) | |
| *G06F 16/17* | (2019.01) | |
| *G06F 16/33* | (2019.01) | |
| *G06F 40/30* | (2020.01) | |

(52) U.S. Cl.
CPC ...... *G06F 16/3329* (2019.01); *G06F 16/1734* (2019.01); *G06F 16/335* (2019.01); *G06F 16/3331* (2019.01); *G06F 40/30* (2020.01)

(58) Field of Classification Search
CPC .. G06F 16/2365; G06F 21/6218; G06F 21/64; G06F 16/22
See application file for complete search history.

(56) References Cited

U.S. PATENT DOCUMENTS

| | | | | |
|---|---|---|---|---|
| 9,934,265 B2* | 4/2018 | Karandikar | ........... | G06F 16/215 |
| 10,296,613 B2* | 5/2019 | Karandikar | ........... | G06F 16/248 |
| 11,023,420 B1* | 6/2021 | Savir | ..................... | G06F 16/174 |
| 11,151,089 B2* | 10/2021 | Savir | ..................... | G06N 20/00 |
| 2005/0076226 A1* | 4/2005 | Boivie | ................... | G06F 21/64 |
| | | | | 713/190 |

(Continued)

FOREIGN PATENT DOCUMENTS

| | | |
|---|---|---|
| CN | 104391881 A | 3/2015 |
| CN | 106656607 A | 5/2017 |

OTHER PUBLICATIONS

The office action of the corresponding Taiwanese application No. 109136181 dated May 6, 2021.

(Continued)

*Primary Examiner* — Olujimi A Adesanya

(74) *Attorney, Agent, or Firm* — CKC & Partners Co., LLC

(57) ABSTRACT

A log processing device and a log processing method thereof are provided. The log processing device divides the original log data into a plurality of block data, transforms a numeric variable of each of the block data into a representative code, and determines whether to perform a combination process for continuous block data to generate a plurality of combinational block data according to a data integrity of each of the block data. The log processing data takes the combinational block data as a log template, and each of the combinational block data corresponds to an event.

18 Claims, 14 Drawing Sheets

(56) References Cited

U.S. PATENT DOCUMENTS

| | | | |
|---|---|---|---|
| 2014/0006010 A1* | 1/2014 | Nor | G06F 40/16 |
| | | | 704/9 |
| 2016/0124823 A1* | 5/2016 | Ruan | G06F 11/079 |
| | | | 714/26 |
| 2016/0259693 A1* | 9/2016 | Sundararaman | G06F 16/2365 |
| 2016/0299934 A1* | 10/2016 | Karandikar | G06F 16/248 |
| 2018/0101423 A1 | 4/2018 | Yoon et al. | |
| 2020/0279052 A1* | 9/2020 | Wilke | H04L 9/3247 |
| 2021/0243026 A1* | 8/2021 | Mohassel | H04L 9/3236 |

OTHER PUBLICATIONS

The Extended European Search Report of the corresponding European application No. 20209608.7 dated Apr. 29, 2021.

* cited by examiner

OLD2

| blk-10 | blk-11 | blk-12 | blk-13 | blk-14 |
|---|---|---|---|---|
| 1586898127706657481 I0414 21:02:07.706586 1 resource_quota_monitor.go:228, QuotaMonitor created object count evaluator for alertmanagers.monitoring.coreos.com |||||

| blk-10 | blk-11 | blk-12 | blk-13 | blk-14 |
|---|---|---|---|---|
| 1586898127706657481 | I0414 | 21:02:07.706586 | 1 | resource_quota_monitor.go:228, |
| blk-15 | blk-16 | blk-17 | blk-18 | blk-19 | blk-20 | blk-21 |
| QuotaMonitor | created | object | count | evaluator | for | alertmanagers.monitoring.coreos.com |

| rblk-10 | rblk-11 | rblk-12 | rblk-13 | rblk-14 |
|---|---|---|---|---|
| EPOCH | IMMDD | HH:MM:SS.SSSSSS | NUM | resource_quota_monitor.go:NUM, |
| rblk-15 | rblk-16 | rblk-17 | rblk-18 | rblk-19 | rblk-20 | rblk-21 |
| QuotaMonitor | created | object | count | evaluator | for | alertmanagers.monitoring.coreos.com |

| cblk-10 | cblk-11 | cblk-12 | cblk-13 | cblk-14 |
|---|---|---|---|---|
| EPOCH | IMMDD | HH:MM:SS.SSSSSS | NUM | resource_quota_monitor.go:NUM, |
| cblk-15 |||||
| QuotaMonitor created object count evaluator for alertmanagers.monitoring.coreos.com |||||

L2

| E10 | E11 | E12 | E13 | E14 | E15 |
|---|---|---|---|---|---|

FIG. 3

OLD3

```
1586574010733936849 I0411 03:00:10.733881 1 trace.go:116, Trace[3365106]: "Get" url:/api/v1/namespaces/
kube-system/endpoints/kube-controller-manager (started: 2020-04-11 03:00:09.845952954 +0000 UTC
m=+1458985.421484430) (total time: 887.906026ms):
```

| blk-22 | blk-23 | blk-24 | blk-25 | blk-26 | blk-27 | blk-28 |
|---|---|---|---|---|---|---|
| 1586574010733936849 | I0411 | 03:00:10.733881 | 1 | trace.go:116, | Trace[3365106]: | "Get" |

| blk-29 |
|---|
| url:/api/v1/namespaces/kube-system/endpoints/kube-controller-manager |

| blk-32 | blk-33 | blk-34 | blk-35 | blk-36 | blk-30 | blk-31 |
|---|---|---|---|---|---|---|
| 3:00:09.845952954 | +0000 | UTC | m=+1458985.421484430) | (total | (started: | 2020-04-11 |

| blk-37 | blk-38 |
|---|---|
| time: | 887.906026ms): |

| rblk-22 | rblk-23 | rblk-24 | rblk-25 | rblk-26 | rblk-27 | rblk-28 |
|---|---|---|---|---|---|---|
| EPOCH | IMMDDD | HH:MM:SS.SSSSSS | NUM | trace.go:NUM, | Trace[NUM]: | "Get" |

| rblk-29 |
|---|
| url:/api/v1/namespaces/kube-system/endpoints/kube-controller-manager |

| rblk-32 | rblk-33 | rblk-34 | rblk-35 | rblk-36 | rblk-30 | rblk-31 |
|---|---|---|---|---|---|---|
| HH:MM:SS.SSSSSSSS | +NUM | UTC | m=+NUM.NUM) | (total | (started: | YYYY-MM-DD |

| rblk-37 | rblk-38 |
|---|---|
| time: | NUM.NUMms): |

FIG. 4

Event database 114

| E1 | cblk-1 | EPOCH |
|---|---|---|
| E2 | cblk-2 | level=info |
| E3 | cblk-3 | ts=YYYY-MM-DDTHH:MM:SS.SSSZ |
| E8 | cblk-8 | "Get" |
| ⋮ | ⋮ | ⋮ |
| E36 | cblk-36 | (total time: NUM.NUMms): |

FIG. 10

LOG PROCESSING DEVICE AND LOG PROCESSING METHOD

CROSS-REFERENCE TO RELATED APPLICATION

This application claims priority to Taiwan Application Ser. No. 109136181, filed Oct. 19, 2020, which is herein incorporated by reference in its entirety.

BACKGROUND

Field of Invention

The present disclosure relates to a log processing device and log processing method thereof. More particularly, the log processing device of the present disclosure replaces variables of original log data to compress the amount of data, provides corresponding combination rule, separates events, and generates log templates.

Description of Related Art

Most of the existing log parsing method use specific symbols (e.g., *) and characters (e.g., DATE, TIME, NUM, IPADDR, PORT, etc.) to replace variables, and then perform data decrement and data compression through a series of preset parsing rules to generate log templates.

However, in the process of converting the original log data to the log template and the event template, not all the preset parsing rules are used. Besides, the application sequence of the preset parsing rules will be different due to the arrangement of the content of the original log data. Even if the content are similar, the original log data with different expressions still need its corresponding parsing rules and the application sequence of the parsing rules, and the events which triggered the original log data cannot be extracted in the process of parsing the original log data, and the variable change in the original log data cannot be explored and analyzed in the process of parsing the original log data.

Accordingly, an urgent need exists in the art to provide a log data parsing mechanism which can parse various original log data according to the same parsing rule and extract events which triggered the original log data during the parsing process.

SUMMARY

An objective of the present invention is to provide a log data parsing mechanism which replaces a variables with a representative code according to a data attribute of multiple block data of an original log data, combines incomplete continuous block data, and generates a log template based on the events corresponding to each of the combined block data and each of the uncombined block data. Accordingly, the log data parsing mechanism of the present disclosure can extract events which triggered the events of the original log data during the parsing process and analyze the variable change in the original log data.

To achieve the aforesaid objective, the present invention discloses a log processing device which comprises a memory and a processor. The memory is configured to store an original log data. The processor is electrically connected to the memory, and is configured to perform the following operations: dividing the original log data into a plurality of block data according to a first rule; transforming a numeric variable of each of the block data into a representative code according to a data attribute of each of the block data; determining whether to perform a combination process on the continuous block data to generate a plurality of combinational block data according to a data integrity of each of the block data; and generating a log template corresponding to the original log data, the log template comprising the combinational log data. Each of the combinational block data corresponds to an event.

Moreover, the present invention further discloses log processing method for a log processing device. The log processing device comprises a memory and a processor. The memory storing an original log data. The log processing method is executed by the processor and comprises the following steps: dividing the original log data into a plurality of block data according to a first rule; transforming a numeric variable of each of the block data into a representative code according to a data attribute of each of the block data; determining whether to perform a combination process for the continuous block data to generate a plurality of combinational block data according to a data integrity of each of the block data; and generating a log template corresponding to the original log data, the log template comprising the combinational block data. Each of the combinational block data corresponds to an event.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 3 depicts an implementation scenario of dealing with an original log data by the log processing device according to the present disclosure;

FIG. 4 depicts an implementation scenario of dealing with an original log data by the log processing device according to the present disclosure;

FIG. 10 is a schematic view of an event database according to the present disclosure;

DETAILED DESCRIPTION

Figure 1:
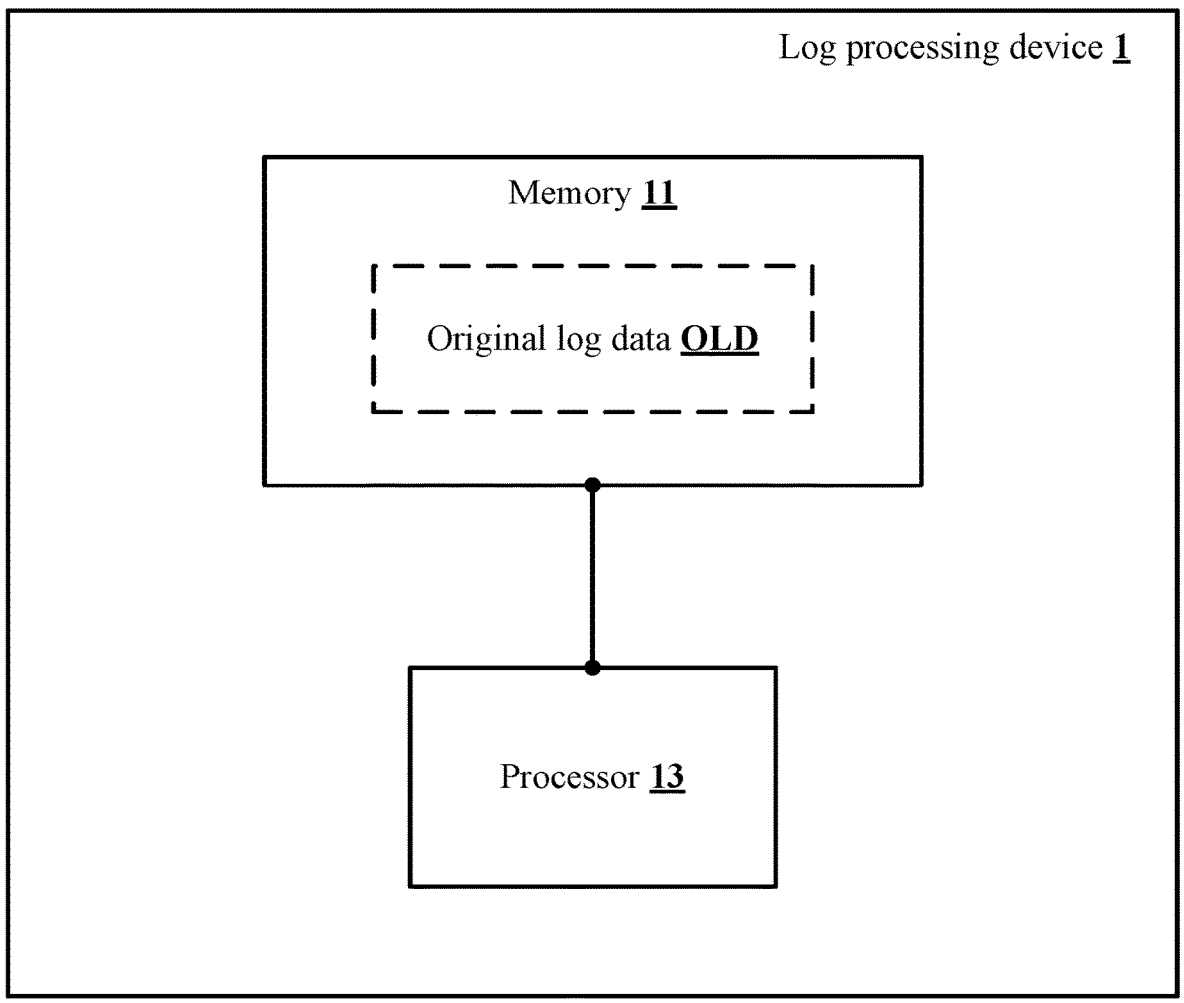
FIG. 1 is a schematic view of a log processing device according to the present disclosure.

Reference will now be made in detail to the present embodiments of the invention, examples of which are illustrated in the accompanying drawings. Wherever possible, the same reference numbers are used in the drawings and the description to refer to the same or like parts.

A first embodiment of the present invention is as shown in FIG. 1 to FIG. 5. FIG. 1 is a schematic view of a log processing device according to the present disclosure. The log processing device 1 includes a memory 11 and a processor 13. The processor 13 is electrically connected to the memory 11. The memory 11 stores an original log data OLD which records files that occur in an operating system or other running software.

The processor 13 divides the original log data OLD into a plurality of block data according to a first rule. Specifically, the original log data is consisted of a plurality of strings, and each of the strings is separated by a blank. The processor 13 takes the blank between each of the strings as the first rule to divide the original log data OLD into the combinational block data.

The processor 13 transforms a numeric variable of each of the block data into a representative code according to a data attribute of each of the block data to display the block data in normalization. The data attribute of the block data is the meaning represented by the string in each of the block data. The data attribute may be time, information, program, database, message, a period, etc., but is not limited thereto. The representative code is a quantitative text that represents the meaning of the numeric variable in the block data.

When transforming the numeric variable, the processor 13 determines whether the numeric variable is existed in the block data, and determines the data attribute of each of the block data. If the numeric variable exists in the block data, the processor 13 replaces the numeric variable with the representative code corresponding to the data attribute so that the block data which includes the numeric variable will be represented by quantitative text. Thus, the overall data volume of the original log data OLD will be decreased.

Next, the processor 13 determines whether to perform a combination process on the continuous block data to generate a plurality of combinational block data according to a data integrity of each of the block data. To be more specific, the processor 13 determines, in order, a data integrity from the first block data of each of the block data according to a second rule, and determines if the meaning of each of the block data is clear according to the data integrity. In this embodiment, the second rule is a semantic analysis. However, in other embodiments, the second rule can also be quotation marks used to describe sentences or brackets used to describe specific content. Those of ordinary skill in the art can understand the setting of the second rule based on the subsequent description. The foregoing semantic analysis is only used for illustration and is not intended to limit the present disclosure.

When the data integrity of at least two of the continuous block data are less than a threshold, the processor 13 combines the at least two of the continuous block data. When the data integrity of one of the at least two of the continuous block data is less than the threshold, and the data integrity of the other one of the at least two of the continuous block data is greater than the threshold, the processor 13 does not combine the at least two of the continuous block data. Briefly speaking, the combinational block data includes single block data with complete meaning and multiple combined continuous block data with incomplete meaning. In other words, the discontinuous block data with incomplete meaning cannot be combined.

Finally, the processor 13 uses the combinational block data as a log template corresponding to the original log data OLD, and each of the combinational block data corresponds to an event.

Figure 2:
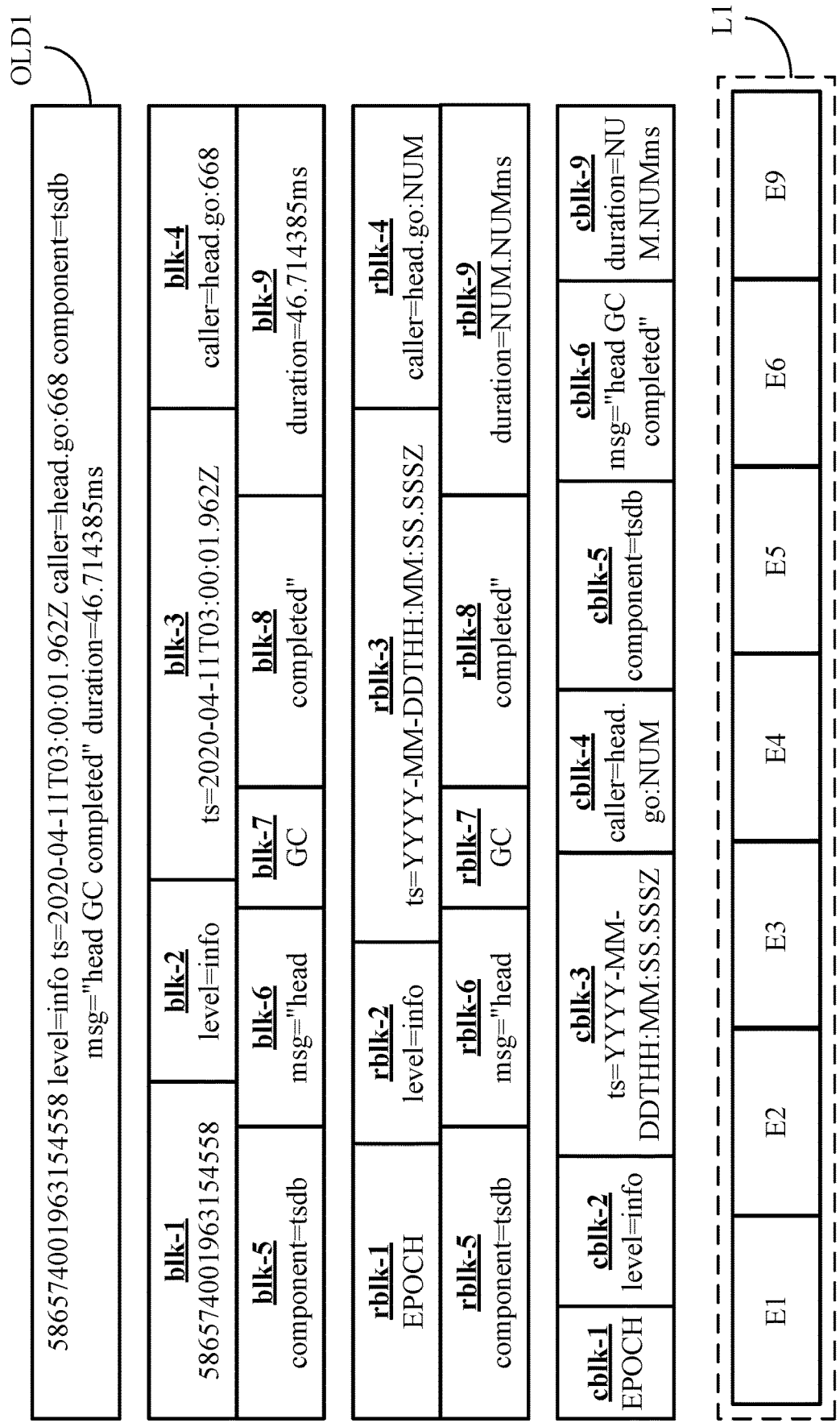
FIG. 2 depicts an implementation scenario of dealing with an original log data by the log processing device according to the present disclosure.

For example, reference is made to FIG. 2, which depicts an implementation scenario of dealing with an original log data by the log processing device according to the present disclosure. The log processing device 1 divides the original log data OLD1 into 9 block data blk-1~blk-9 according to the blank between each of the strings, and determines whether each of the block data includes a numeric variable.

When the processor 13 of the log processing device 1 determines that the block data blk-1 includes the numeric variable "586574001963154558", the processor 13 further determines that the data attribute of the string "586574001963154558" is log system time, and replace the numeric variable "586574001963154558" with the representative code "EPOCH" corresponding to the log system time, as the block data rblk-1 shown in FIG. 2.

Next, the processor 13 determines that there is no numeric variable in the string "level=info" of the block data blk-2, and does not change the content of the block data blk-2, so the processor 13 directly treats the string "level=info" as normalized block data rblk-2.

When the processor 13 determines that the string "ts=2020-04-11T03:00:01.962Z" in the block data blk-3 includes numeric variable, it further determines that the data attribute of the string in the block data blk-3 is an application program time. Therefore, the log processing device 1 replaces the numeric variables in the string with the representative codes corresponding to the year, month, day, hour, minute, and second in the application program time. The numeric variables are replaced and displayed in normalized expressions as the block data rblk-3 "ts=YYYY-MM-DDTHH:MM:SS.SSSZ".

When the processor 13 determines that the string "caller=head.go:668" in the block data blk-4 has a numeric variable, it further determines that the data attribute of the string in the block data blk-4 is a trigger program. Since the data attribute of the trigger program in the block data blk-4 is not simply represented by the variable "668", the processor 13 replaces the numeric variable in the string with the representative code corresponding to the general number. The numeric variable is replaced with the block data rblk-4 displayed by the normalization expression is "caller=head.go:NUM".

The processor 13 sequentially determines that the string "component=tsdb" of the block data blk-5, the string "msg="head" of the block data blk-6, the string "GC" the block data blk-7 and the string "completed" of the block data blk-8 does not include any numeric variable, the string of the block data blk-5~blk-8 will not be changed, so the string "component=tsdb", "msg="head", "GC", and "completed" are regarded as normalized block data rblk-4~rblk-8.

At last, the processor 13 determines that the string "duration=46.714385 ms" of the block data blk-9 includes numeric variable, it further determines that the data attribute of the string "duration=46.714385 ms" of the block data blk-9 is the execution time. Since the data attribute of the execution time in the block data blk-9 is not simply represented by the numeric variable "46.714385", the log processing device 1 replaces the numeric variable "46.714385"

in the string with the representative code corresponding to the general number, and the numeric variable is replaced with the block data rblk-9 displayed with normalized expression "duration=NUM.NUMms".

After the numeric variable of the block data blk-1~blk-9 are replaced with corresponding representative codes, the log processing device 1 starts the combination process. In detail, the combination process can be regarded as one of the procedures in the process. When the processor 13 executes the combination process, the processor 13 determines the data integrity, based on semantic analysis, of each of the block data rblk-1~rblk-9 starting from the first block data rblk-1 and sequentially to the ninth block data rblk-9 in order to confirm whether each of the block data rblk-1~rblk-9 has complete meaning.

For ease of description, in this embodiment, the threshold is assumed to be 100%. If the block data has a complete meaning, it means that the data integrity of the block data is equal to the threshold (i.e., the data integrity is 100%). If the block data does not have a complete meaning or the meaning is unclear, it means the data integrity of the block data is less than the threshold (i.e., the data integrity is less than 100% or the data integrity is equal to 0%).

It shall be appreciated that, in other embodiments, the threshold can also be set to other values such as 90% or 80%. If the block data has complete meaning, or even if it is incomplete but the actual complete meaning can be inferred, it means that the data integrity is greater than or equal to the threshold 90%. If the block data does not have complete meaning and the actual meaning cannot be inferred or the meaning is unclear, it means that the data integrity is less than 90% of the threshold. However, those of ordinary skill in the art can understand that the threshold can be set by the user who would like to analyze the log data according to the semantic level to be interpreted based on the foregoing description. The foregoing value is only used for illustration and is not intended to limit the present disclosure.

The string "EPOCH" of the block data rblk-1 represents the log system time. The processor 13 determines that the block data rblk-1 has a complete meaning which means the data integrity is equal to the threshold 100%. The processor 13 generates the combinational block data cblk-1 "EPOCH" after executing the combination process on the block data rblk-1. The string "level=info" of the block data rblk-2 represents the log level. The processor 13 determines that the block data rblk-2 has a complete meaning which means the data integrity is equal to the threshold 100%. The processor 13 generates the combinational block data cblk-2 "level=info" after executing the combination process on the block data rblk-2. The string "ts=YYYY-MM-DDTHH: MM:SS.SSSZ" of the block data rblk-3 represents the application program time. The processor 13 determines that the block data rblk-3 has a complete meaning which means the data integrity is equal to the threshold 100%. The processor 13 generates the combinational block data cblk-3 "ts=YYYY-MM-DDTHH:MM:SS.SSSZ" after executing the combination process on the block data rblk-3.

The string "caller=head.go:NUM" of the block data rblk-4 represents the trigger program. The processor 13 determines that the block data rblk-4 has a complete meaning which means the data integrity is equal to the threshold 100%. The processor 13 generates the combinational block data cblk-4 "caller=head.go:NUM" after executing the combination process on the block data rblk-4. The string "component=tsdb" of the block data rblk-5 represents the trigger element. The processor 13 determines that the block data rblk-5 has a complete meaning which means the data integrity is equal to the threshold 100%. The processor 13 generates the combinational block data cblk-5 "component=tsdb" after executing the combination process on the block data rblk-5.

The string "msg="head" of the block data rblk-6 includes a quotation mark that will be used when describing sentences. Since the block data rblk-6 includes only one quotation mark, it implies that the meaning of the string in the block data rblk-6 is incomplete, and the processor 13 determines that the data integrity of the block data rblk-6 is less than the threshold 100%. Regarding the string "GC" of the block data rblk-7, the processor 13 determines that the meaning of the string "GC" in the block data rblk-7 is incomplete, and the data integrity is less than the threshold 100%. When the processor 13 determines that the data integrity of the continuous block data rblk-6 and the block data rblk-7 are both smaller than the threshold, the combinational block data "msg="head GC" is generated after executing the combination process on the block data rblk-6 and the block data rblk-7. Then, the processor 13 determines whether the data integrity of the merged block data "msg="head GC" is equal to the threshold.

Since the combinational block data includes only one quotation mark in "msg="head GC", it implies that the meaning of the string in the block data rblk-6 is incomplete, so the processor 13 determines that the data integrity is less than the threshold 100%. Therefore, the processor 13 continues to determine the data integrity of the block data rblk-8.

The string "completed"" of the block data rblk-8 includes a quotation mark that will be used when describing sentences. Since the block data rblk-8 includes only one quotation mark, it implies that the meaning of the string in the block data rblk-8 is incomplete, and the processor 13 determines that the data integrity of the block data rblk-8 is less than the threshold 100%. Then, the processor 13 executes the combination process to combine the continuous block data rblk-6, block data rblk-7, and block data rblk-8 whose data integrity is less than the threshold 100% and to generate the combinational block data cblk-6 "msg="head GC completed"". The processor 13 determines that the combinational block data cblk-6"msg="head GC completed"" is a trigger message which has a complete meaning, and the data integrity is equal to the threshold 100%.

The string "duration=NUM.NUMms" of the block data rblk-9 represents the execution time of "caller=head.go:668 component=tsdb msg="head GC completed"" in the original log data OLD1. The processor 13 determines that the block data rblk-9 has a complete meaning which means the data integrity is equal to the threshold 100%. The processor 13 generates the combinational block data cblk-4 "duration=NUM.NUMms" after executing the combination process on the block data rblk-9.

After finishing the combination process procedure, the log processing device 1 uses the combinational block data cblk-1 to cblk-9 as a log template L1 corresponding to the original log data OLD1. The log template L1 includes event E1, event E2, event E3, event E4, event E5, event E6, and event E9. Event E1 corresponds to the combinational block data cblk-1. Event E2 corresponds to the combinational block data cblk-2. Event E3 corresponds to the combinational block data cblk-3. Event E4 corresponds to the combinational block data cblk-4. Event E5 corresponds to the combinational block data cblk-5. Event E6 corresponds to the combinational block data cblk-6. Event E9 corresponds to the combinational block data cblk-9. Briefly speaking, each of the combinational block data corresponds to an event.

For another example, reference is made to FIG. 3 which depicts an implementation scenario of dealing with an original log data by the log processing device according to the present disclosure. The log processing device 1 divides the original log data OLD2 into 12 block data blk-10~blk-21 according to the blank between each of the strings, and determines whether each of the block data includes a numeric variable.

When the processor 13 of the log processing device 1 determines that the block data blk-10 includes the numeric variable "1586898127706657481", the processor 13 further determines that the data attribute of the string"1586898127706657481" represents log system time, and replace the numeric variable "1586898127706657481" with the representative code "EPOCH" corresponding to the log system time, as the block data rblk-10 shown in FIG. 3.

Next, the processor 13 determines that the block data blk-11 includes the numeric variable "10414", the processor 13 further determines that the data attribute of the string"10414" represents application program time, and replaces the numeric variables in the string with the representative codes corresponding to the month and day in the application program time. The numeric variables are replaced and displayed in normalized expressions as the block data rblk-11 "IMMDD".

The processor 13 determines that the block data blk-12 includes the numeric variable "21:02:07.706586", the processor 13 further determines that the data attribute of the string"21:02:07.706586" represents application program time, and replaces the numeric variables in the string with the representative codes corresponding to the hour, minute, and second in the application program time. The numeric variables are replaced and displayed in normalized expressions as the block data rblk-12 "HH:MM:SS.SSSSSS".

The processor 13 determines that the block data blk-13 includes the numeric variable "1", the processor 13 further determines that the data attribute of the string "1" represents number, and replaces the numeric variables with the representative codes corresponding to number. The numeric variable are replaced and displayed in normalized expressions as the block data rblk-13 "NUM".

The processor 13 determines that the block data blk-14 includes the numeric variable "resource_quota_monitor.go: 228,", the processor 13 further determines that the data attribute of the string"resource_quota_monitor.go:228," represents the trigger program. Since the data attribute of the trigger program in the block data blk-14 is not only simply represented by the numeric variable "228", the processor 13 replaces the numeric variable in the string with a representative code corresponding to a general number. The numeric variable are replaced and displayed in normalized expressions as the block data rblk-14 "resource_quota_monitor.go: NUM,".

The processor 13 sequentially determines that the string "QuotaMonitor" of the block data blk-15, the string "created" of the block data blk-16, the string "object" the block data blk-17, the string "count" of the block data blk-18, the string "evaluator" of the block data blk-19, the string "for" of the block data blk-20, and the string "alertmanagers-.monitoring.coreos.com" of the block data blk-21 does not include any numeric variable, the string of the block data blk-15~blk-21 will not be changed, so the string "Quota-Monitor", "created", "object", "count", "evaluator", "for", and "alertmanagers.monitoring.coreos.com" are regarded as normalized block data rblk-15~rblk-21.

After the numeric variable of the block data blk-10~blk-21 are replaced with corresponding representative codes, the processor 13 starts the combination process. The processor 13 determines the data integrity of each of the block data rblk-10~rblk-21 starting from the first block data rblk-10 sequentially to the block data rblk-21 in order to confirm whether each of the block data rblk-10~rblk-21 has complete meaning.

The string "EPOCH" of the block data rblk-10 represents the log system time. The processor 13 determines that the block data rblk-10 has a complete meaning which means the data integrity is equal to the threshold 100%. The processor 13 generates the combinational block data cblk-10 "EPOCH" after executing the combination process on the block data rblk-10. The string "IMMDD" of the block data rblk-11 represents the application program time. The processor 13 determines that the block data rblk-11 has a complete meaning which means the data integrity is equal to the threshold 100%. The processor 13 generates the combinational block data cblk-11 "IMMDD" after executing the combination process on the block data rblk-11. The string "HH:MM:SS.SSSSSS" of the block data rblk-12 represents the application program time. The processor 13 determines that the block data rblk-12 has a complete meaning which means the data integrity is equal to the threshold 100%.

The processor 13 generates the combinational block data cblk-12 "HH:MM:SS.SSSSSS" after executing the combination process on the block data rblk-12.

The string "NUM" of the block data rblk-13 represents the number. The processor 13 determines that the block data rblk-13 has a complete meaning which means the data integrity is equal to the threshold 100%. The processor 13 generates the combinational block data cblk-13 "NUM" after executing the combination process on the block data rblk-13. The string "resource_quota_monitor.go:NUM," of the block data rblk-14 represents the trigger program. The processor 13 determines that the block data rblk-14 has a complete meaning which means the data integrity is equal to the threshold 100%. The processor 13 generates the combinational block data cblk-14 resource_quota_monitor.go: NUM," after executing the combination process on the block data rblk-14.

The processor 13 determines that the meaning of the string "QuotaMonitor" of the block data rblk-15 is incomplete, and determines the data integrity of the block data rblk-15 is less than the threshold 100%. Then, the processor 13 determines that the meaning of the string "created" of the block data rblk-16 is incomplete, and determines the data integrity of the block data rblk-16 is less than the threshold 100%. Since the data integrity of the continuous block data rblk-15 and rblk-16 are less than the threshold (i.e., incomplete), the processor 13 executes the combination process on the block data rblk-15 and rblk-16, generates the combinational block data "QuotaMonitor created", and determines whether the data integrity of the combinational block data "QuotaMonitor created" is equal to the threshold.

The meaning of the string "QuotaMonitor created" of the combinational block data is still incomplete, so the processor 13 continues to determine the data integrity of the block data rblk-17. The processor 13 determines that the meaning of the string "object" of the block data rblk-17 is incomplete, and determines the data integrity of the block data rblk-17 is less than the threshold 100%. Under the circumstance, the processor 13 executes the combination process on the combinational block data "QuotaMonitor created" and the string "object" of the block data rblk-17, generates the combinational block data "QuotaMonitor created object", and determines whether the data integrity of the combinational block data "QuotaMonitor created object" is equal to the threshold.

However, the meaning of the string "QuotaMonitor created object" of the combinational block data is still incomplete which means the data integrity of the combinational block data "QuotaMonitor created object" is less than the threshold, so the processor 13 continues to determine the data integrity of the block data rblk-18.

The processor 13 determines that the meaning of the string "count" of the block data rblk-18 is incomplete, and determines the data integrity of the block data rblk-18 is less than the threshold 100%. Similar to the aforesaid processing, under the circumstances that the data integrity of the combinational block data "QuotaMonitor created object" and rblk-18 are less than the threshold (i.e., incomplete), the processor 13 executes the combination process on the combinational block data "QuotaMonitor created object" and the string "count" of the block data rblk-18, generates the combinational block data "QuotaMonitor created object count", and determines whether the data integrity of the combinational block data "QuotaMonitor created object count" is equal to the threshold.

However, the meaning of the string "QuotaMonitor created object count" of the combinational block data is still incomplete which means the data integrity of the combinational block data "QuotaMonitor created object count" is less than the threshold 100%, so the processor 13 continues to determine the data integrity of the block data rblk-19.

The processor 13 determines that the meaning of the string "evaluator" of the block data rblk-19 is incomplete, and determines the data integrity of the block data rblk-19 is less than the threshold 100%. Therefore, the processor 13 executes the combination process on the combinational block data "QuotaMonitor created object count" and the string "evaluator" of the block data rblk-19, generates the combinational block data "QuotaMonitor created object count evaluator", and determines whether the data integrity of the combinational block data "QuotaMonitor created object count evaluator" is equal to the threshold.

The processor 13 determines that the meaning of the string "QuotaMonitor created object count evaluator" of the combinational block data is still incomplete which means the data integrity of the combinational block data "QuotaMonitor created object count evaluator" is less than the threshold 100%, so the processor 13 continues to determine the data integrity of the block data rblk-20.

The processor 13 determines that the meaning of the string "for" of the block data rblk-20 is incomplete, and determines the data integrity of the block data rblk-20 is less than the threshold 100%. Therefore, the processor 13 executes the combination process on the combinational block data "QuotaMonitor created object count evaluator" and the string "for" of the block data rblk-20, generates the combinational block data "QuotaMonitor created object count evaluator", and determines whether the data integrity of the combinational block data "QuotaMonitor created object count evaluator for" is equal to the threshold.

The processor 13 determines that the meaning of the string "QuotaMonitor created object count evaluator for" of the combinational block data is still incomplete which means the data integrity of the combinational block data "QuotaMonitor created object count evaluator for" is less than the threshold 100%, so the processor 13 continues to determine the data integrity of the block data rblk-21.

The processor 13 determines that the meaning of the string "alertmanagers.monitoring.coreos.com" of the block data rblk-21 is incomplete, and determines the data integrity of the block data rblk-21 is less than the threshold 100%. Under the circumstance, the processor 13 executes the combination process on the combinational block data "QuotaMonitor created object count evaluator for" and the string "alertmanagers.monitoring.coreos.com" of the block data rblk-21, generates the combinational block data "QuotaMonitor created object count evaluator for alertmanagers.monitoring.coreos.com", and determines that the combinational block data "QuotaMonitor created object count evaluator for alertmanagers.monitoring.coreos.com" represents trigger message. Therefore, the processor 13 obtains the string "QuotaMonitor created object count evaluator for alertmanagers.monitoring.coreos.com" by combining the strings of the block data rblk-15, rblk-16, rblk-17, rblk-18, rblk-19, rblk-20, and rblk-21, and takes the string "QuotaMonitor created object count evaluator for alertmanagers.monitoring.coreos.com" as the combinational block data cblk-15, as shown in FIG. 3.

After finishing the combination process procedure, the log processing device 1 uses the combinational block data cblk-10 to cblk-21 as a log template L2 corresponding to the original log data OLD2. The log template L1 includes event E10, event E11, event E12, event E13, event E14, and event E15. Event E10 corresponds to the combinational block data cblk-10. Event E11 corresponds to the combinational block data cblk-11. Event E12 corresponds to the combinational block data cblk-12. Event E13 corresponds to the combinational block data cblk-13. Event E14 corresponds to the combinational block data cblk-14. Event E15 corresponds to the combinational block data cblk-15.

Figure 5:
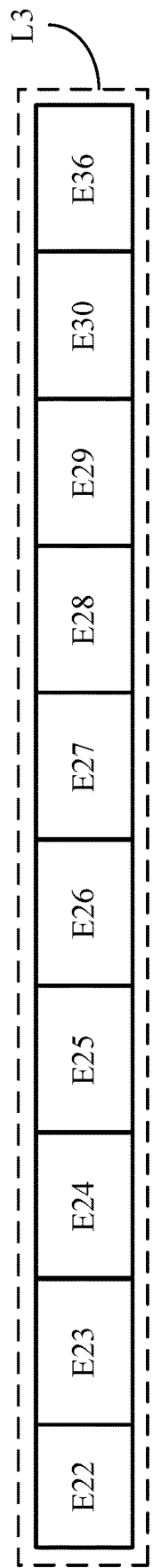
FIG. 5 depicts an implementation scenario of dealing with an original log data by the log processing device according to the present disclosure.

For another example, reference is made to FIG. 4 and FIG. 5 which depict an implementation scenario of dealing with an original log data by the log processing device according to the present disclosure. The processor 13 of the log processing device 1 divides the original log data OLD3 into 17 block data blk-22~blk-38 according to the blank between each of the strings, and determines whether each of the block data includes a numeric variable.

When the processor 13 determines that the block data blk-22 includes the numeric variable "1586574010733936849", the processor 13 further determines that the data attribute of the string "1586574010733936849" represents log system time, and replace the numeric variable "1586574010733936849" with the representative code "EPOCH" corresponding to the log system time, as the block data rblk-22 shown in FIG. 4.

Next, the processor 13 determines that the block data blk-23 includes the numeric variable "10411", the processor 13 further determines that the data attribute of the string "10411" represents application program time, and replaces the numeric variables in the string with the representative codes corresponding to the month and day in the application program time. The numeric variables are replaced and displayed in normalized expressions as the block data rblk-23 "IMMDD".

The processor 13 determines that the block data blk-24 includes the numeric variable "03:00:10.733881", the processor 13 further determines that the data attribute of the string "03:00:10.733881" represents application program time, and replaces the numeric variables in the string with the representative codes corresponding to the hour, minute, and second in the application program time. The numeric variables are replaced and displayed in normalized expressions as the block data rblk-24 "HH:MM:SS.SSSSSS".

The processor 13 determines that the block data blk-25 includes the numeric variable "1", the processor 13 further determines that the data attribute of the string "1" represents number, and replaces the numeric variables with the representative codes corresponding to number. The numeric variable are replaced and displayed in normalized expressions as the block data rblk-25 "NUM".

The processor 13 determines that the block data blk-26 includes the numeric variable "trace.go:116,", the processor 13 further determines that the data attribute of the string"trace.go:116," represents the trigger program. Since the data attribute of the trigger program in the block data blk-26 is not only simply represented by the numeric variable "116", the processor 13 replaces the numeric variable in the string with a representative code corresponding to a general number. The numeric variable are replaced and displayed in normalized expressions as the block data rblk-14 "trace.go:NUM,".

The processor 13 determines that the block data blk-27 includes the numeric variable "Trace[3365106]:", the processor 13 further determines that the data attribute of the string"Trace[3365106]:" represents the trigger trace. Since the data attribute of the trigger program in the block data blk-27 is not only simply represented by the numeric variable "3365106", the processor 13 replaces the numeric variable in the string with a representative code corresponding to a general number. The numeric variable are replaced and displayed in normalized expressions as the block data rblk-27 "Trace[NUM]:".

The processor 13 sequentially determines that the string ""Get"" of the block data blk-28, the string "url:/api/v1/namespaces/kube-system/endpoints/kube-controller-manager" of the block data blk-29, and the string "(started:" the block data blk-30 does not include any numeric variable, the string of the block data blk-28~blk-30 will not be changed, so the string ""Get"", "url:/api/v1/namespaces/kube-system/endpoints/kube-controller-manager", and "(started:" are regarded as normalized block data rblk-28~rblk-30.

The processor 13 determines that the block data blk-31 includes the numeric variable "2020-04-11", the processor 13 further determines that the data attribute of the string"2020-04-11" represents data, and replaces the numeric variables in the string with the representative codes corresponding to the year, month, and day. The numeric variables are replaced and displayed in normalized expressions as the block data rblk-31 "YYYY-MM-DD".

The processor 13 determines that the block data blk-32 includes the numeric variable "3:00:09.845952954", the processor 13 further determines that the data attribute of the string"3:00:09.845952954" represents application program time, and replaces the numeric variables in the string with the representative codes corresponding to the hour, minute, and second in the application program time. The numeric variables are replaced and displayed in normalized expressions as the block data rblk-32 "HH:MM:SS.SSSSSSSSS".

The processor 13 determines that the block data blk-33 includes the numeric variable "+0000", the processor 13 further determines that the data attribute of the string "+0000" represents time. Although the data attribute of the block data blk-33 is time, since the "+0000" in the block data blk-33 does not indicate the complete time, when the block data blk-33 is analyzed separately, the numeric variable "0000" has no meaning. Therefore, the processor 13 replaces the numeric variable in the string with the representative code corresponding to the general number, and the block data rblk-33 displayed in the normalized expression "+NUM" after the numeric variable is replaced.

The processor 13 sequentially determines that the string "UTC" of the block data blk-34 does not include any numeric variable, the string of the block data blk-34 will not be changed, so the string "UTC" is regarded as normalized block data rblk-34.

The processor 13 determines that the block data blk-35 includes the numeric variable "m=+1458985.421484430)", the processor 13 further determines that when the block data blk-35 is analyzed separately, the numeric variable "1458985.421484430" has no meaning, so the processor 13 replaces the numeric variables with the representative codes corresponding to number. The numeric variable are replaced and displayed in normalized expressions as the block data rblk-35 "m=+NUM.NUM)".

The processor 13 sequentially determines that the string "(total" of the block data blk-36 and the string "time:" of the block data blk-37 do not include any numeric variable, the string of the block data blk-36 and the string of the block data blk-37 will not be changed, so the string "(total" is regarded as normalized block data rblk-36 and the string "time:" is regarded as normalized block data rblk-37.

The processor 13 determines that the block data blk-38 includes the numeric variable "887.906026 ms):", although the data attribute of the block data blk-38 is time, the processor 13 determines that when the block data blk-38 is analyzed separately, the numeric variable "887.90602" has no meaning, so the processor 13 replaces the numeric variables with the representative codes corresponding to number. The numeric variable are replaced and displayed in normalized expressions as the block data rblk-38 "NUM.NUMms):".

After the numeric variable of the block data blk-22~blk-38 are replaced with corresponding representative codes, the processor 13 starts the combination process. The processor 13 determines the data integrity of each of the block data rblk-22~rblk-38 starting from the first block data rblk-22 sequentially to the block data rblk-38 in order to confirm whether each of the block data rblk-22~rblk-38 has complete meaning.

The string "EPOCH" of the block data rblk-22 represents the log system time. The processor 13 determines that the block data rblk-22 has a complete meaning which means the data integrity is equal to the threshold 100%. The processor 13 generates the combinational block data cblk-22 "EPOCH" after executing the combination process on the block data rblk-22. The string "IMMDD" of the block data rblk-23 represents the application program time. The processor 13 determines that the block data rblk-23 has a complete meaning which means the data integrity is equal to the threshold 100%. The processor 13 generates the combinational block data cblk-23 "IMMDD" after executing the combination process on the block data rblk-23. The string "HH:MM:SS.SSSSSS" of the block data rblk-24 represents the application program time. The processor 13 determines that the block data rblk-24 has a complete meaning which means the data integrity is equal to the threshold 100%. The processor 13 generates the combinational block data cblk-24"HH:MM:SS.SSSSSS" after executing the combination process on the block data rblk-24.

The string "NUM" of the block data rblk-25 represents the number. The processor 13 determines that the block data rblk-25 has a complete meaning which means the data integrity is equal to the threshold 100%. The processor 13 generates the combinational block data cblk-25 "NUM" after executing the combination process on the block data rblk-25.

The string "trace.go:NUM," of the block data rblk-26 represents the trigger program. The processor 13 determines that the block data rblk-26 has a complete meaning which means the data integrity is equal to the threshold 100%. The processor 13 generates the combinational block data cblk-26 "trace.go:NUM," after executing the combination process on the block data rblk-26. The string "Trace[NUM]:" of the block data rblk-27 represents the trigger trace. The processor 13 determines that the block data rblk-27 has a complete meaning which means the data integrity is equal to the threshold 100%. The processor 13 generates the combinational block data cblk-27 "Trace[NUM]:" after executing the combination process on the block data rblk-27.

The string ""Get"" of the block data rblk-28 includes a quotation mark that will be used when describing sentences, and the string ""Get"" includes two quotation marks in one sentence, it implies that the meaning of the string in the block data rblk-28 is complete, and the processor 13 determines that the data integrity of the block data rblk-28 is equal to the threshold 100%. The processor 13 generates the combinational block data cblk-28 ""Get"" after executing the combination process on the block data rblk-28.

The string "url:/api/v1/namespaces/kube-system/endpoints/kube-controller-manager" of the block data rblk-29 represents the trigger message. The processor 13 determines that the block data rblk-29 has a complete meaning which means the data integrity is equal to the threshold 100%. The processor 13 generates the combinational block data cblk-29 "url:/api/v1/namespaces/kube-system/endpoints/kube-controller-manager" after executing the combination process on the block data rblk-29.

The message represented by the string "(started:" of the block data rblk-30 is incomplete, so the processor 13 determines that the data integrity is less than the threshold 100%. Furthermore, the string "(started:" only includes a left parenthesis in the block data rblk-30, but not a right parenthesis, so it implies that the string in the block data rblk-30 is not a complete sentence.

Then, the processor 13 determines that the string "YYYY-MM-DD" of the block data rblk-31 includes year, month, and day which belong to the date. The data integrity of the block data rblk-31 should be equal to the threshold. However, the block data rblk-23 has recorded the application date of the original log data OLD3, and there should not be two different application dates for the same log event, and the previous continuous block data rblk-30 is an incomplete sentence. Therefore, the processor 13 determines that the date of the block data rblk-31 should be the date that exists in the meaning expressed by the string "(started:" of the block data rblk-30, so the processor 13 determines the data integrity of the block data rblk-31 is less than the threshold. Since the data integrity of the continuous block data rblk-30 and rblk-31 are less than the threshold, the processor 13 combines the block data rblk-30 and rblk-31, generates the combinational block data "(started: YYYY-MM-DD", and determines the combinational block data "(started: YYYY-MM-DD" is incomplete which means that the data integrity of the combinational block data "(started: YYYY-MM-DD" is less than the threshold 100%, so the processor 13 continues to determine the data integrity of the block data rblk-32.

The string "HH:MM:SS.SSSSSSSSS" of the block data rblk-32 includes hour, minute, and second, so the string of the block data rblk-32 represents the application program time, and the data integrity of the block data rblk-32 should be equal to the threshold. However, the block data rblk-24 has recorded the application time of the original log data OLD3, and there should not be two different application times for the same log event, so the processor 13 determines that the time of the block data rblk-32 may be the time related to the string "(started:" of the block data rblk-30. The processor 13 determines that the data integrity of the block data rblk-32 is less than the threshold, and executes the combination process on the combinational block data "(started: YYYY-MM-DD" and the string of block data rblk-32 "HH:MM:SS.SSSSSSSSS" to generate the combinational block data "(started: YYYY-MM-DD HH:MM:SS.SSSSSSSSS". However, the meaning of the combinational block data "(started: YYYY-MM-DD HH:MM:SS.SSSSSSSSS" is still incomplete which means the data integrity is less than the threshold 100%, and the processor 13 continues to determines the data integrity of the next block data rblk-33.

The string "+NUM" of the block data rblk-33 represents the general number, and the processor 13 cannot determine the intended meaning of the block data rblk-33 based on a single string, so the processor 13 determines that the data integrity is less than the threshold 100%. Under the circumstances that the data integrity of the combinational block data "(started: YYYY-MM-DD HH:MM:SS.SSSSSSSSS" and the data integrity of the block data rnlk-33 are less than the threshold (i.e., incomplete), the processor 13 executes the combination process on the combinational block data "(started: YYYY-MM-DD HH:MM:SS.SSSSSSSSS" and the string "+NUM" of the block data mlk-33 to generate the combinational block data "(started: YYYY-MM-DD HH:MM:SS.SSSSSSSSS+NUM", and determines whether the data integrity of the combinational block data "(started: YYYY-MM-DD HH:MM:SS.SSSSSSSSS+NUM" is greater than or equal to the threshold.

However, the meaning of the combinational block data "(started: YYYY-MM-DD HH:MM:SS.SSSSSSSSS+NUM" is still incomplete which means the data integrity is less than the threshold 100%, and the processor 13 continues to determines the data integrity of the next block data rblk-34.

The string "UTC" of the block data rblk-34 represents the meaning of Coordinated Universal Time, so there should be a time-related representative code in the block data before or after the block data rblk-34, and the string "UTC" has no meaning when it is analyzed separately. Therefore, the data integrity of the block data rblk-34 is less than the threshold 100%. The combinational block data "(started: YYYY-MM-DD HH:MM:SS.SSSSSSSSS+NUM" includes the time-related representative code "HH:MM:SS.SSSSSSSSS", so the processor 13 executes the combination process on the combinational block data "(started: YYYY-MM-DD HH:MM:SS.SSSSSSSSS+NUM" and the string "UTC" of the block data rblk-34 to generate the combinational block data "(started: YYYY-MM-DD HH:MM:SS.SSSSSSSSS+NUM UTC" and to determine whether the data integrity of the combinational block data "(started: YYYY-MM-DD HH:MM:SS.SSSSSSSSS+NUM UTC" is greater than or equal to the threshold.

However, the meaning of the combinational block data "(started: YYYY-MM-DD HH:MM:SS.SSSSSSSSS+NUM UTC" is still incomplete which means the data integrity is less than the threshold 100%, and the processor 13 continues to determines the data integrity of the next block data rblk-35.

The meaning of the string "m=+NUM.NUM)" of the block data rblk-35 is still incomplete which means the data integrity of the string "m=+NUM.NUM)" is less than the threshold 100%. The string "m=+NUM.NUM)" of the block data rblk-35 only includes a right parenthesis without a left parenthesis, so it implies that the block data rblk-35 is an incomplete sentence. Therefore, the processor 13 executes the combination process on the combinational block data "(started: YYYY-MM-DD HH:MM:SS.SSSSSSSSS+NUM UTC" and the string "m=+NUM.NUM)" of the block data rblk-35 to generate the string "(started: YYYY-MM-DD HH:MM:SS.SSSSSSSSS+NUM UTC m=+NUM.NUM)" of the combinational block data cblk-30. The processor 13 determines that the string "(started: YYYY-MM-DD HH:MM:SS.SSSSSSSSS+NUM UTC m=+NUM.NUM)" of the combinational block data cblk-30 represents the start time, so the data integrity of the combinational block data cblk-30 is equal to the threshold.

It shall be noted that in order to determine which block data in the block data rblk-22~rblk-38 need to be combined into the combinational block data more quickly, the processor 13 can use the quotation marks of the aforementioned description sentence, or parentheses as the second rule, and combines the string, with single quotation mark or parentheses, of the block data.

The message represented by the string "(total" of the block data rblk-36 is incomplete which means the data integrity is less than the threshold 100%. As mentioned above, the string "(total" of the data rblk-36 only includes one left parenthesis without right parenthesis, so it implies that the string in the block data rblk-36 is incomplete sentence.

Next, the processor 13 determines that the string "time" of the block data rblk-37 represents time, but the string of the block data rblk-37 does not include any time-related representative code. Thus, the processor 13 determines that the data integrity is less than the threshold 100%. The processor 13 executes the combination process to combine the strings of the block data rblk-36 and rblk-37 to generate the combinational block data "(total time", and determines whether the data integrity of the combinational block data "(total time" is greater than or equal to the threshold.

Since the combinational block data "(total time" means the overall time and does not include the time-related representative code, so the processor 13 still cannot interpret the meaning represented by the combinational block data "(total time". Thus, the processor 13 determines that the data integrity is less than the threshold 100%, and continues to determine the data integrity of the block data rblk-38.

The meaning of the string "NUM.NUMms):" of the block data rblk-38 is still incomplete which means the data integrity of the string "m=+NUM.NUM)" is less than the threshold 100%. The string "NUM.NUMms):" of the block data rblk-38 only includes a right parenthesis without a left parenthesis, so it implies that the block data rblk-38 is an incomplete sentence. Therefore, the processor 13 executes the combine process on the combinational block data "(total time", corresponding to the block data rblk-36 and rblk-37, and the string "NUM.NUMms):" of the block data rblk-38 to generate the combinational block data "(total time NUM.NUMms):". The processor 13 determines that the combinational block data "(total time NUM.NUMms):" represents execution time, and the data integrity of the combinational block data clbk-36 is equal to the threshold.

After finishing the combination process procedure, the processor 13 uses the combinational block data cblk-22 to cblk-36 as a log template L3 corresponding to the original log data OLD3 The log template L3 includes event E22, event E23, event E24, event E25, event E26, event E27, event E28, event E29, event E30, and event E36. Event E22 corresponds to the combinational block data cblk-22. Event E23 corresponds to the combinational block data cblk-23. Event E24 corresponds to the combinational block data cblk-24. Event E25 corresponds to the combinational block data cblk-25. Event E26 corresponds to the combinational block data cblk-26. Event E27 corresponds to the combinational block data cblk-27. Event E28 corresponds to the combinational block data cblk-28. Event E29 corresponds to the combinational block data cblk-29. Event E30 corresponds to the combinational block data cblk-30. Event E36 corresponds to the combinational block data cblk-36.

It shall appreciated that the contents of the original log data OLD1, OLD2, OLD3, the analysis method and the meaning of each of the block data are only examples, and are not intended to limit the present disclosure.

Figure 6:
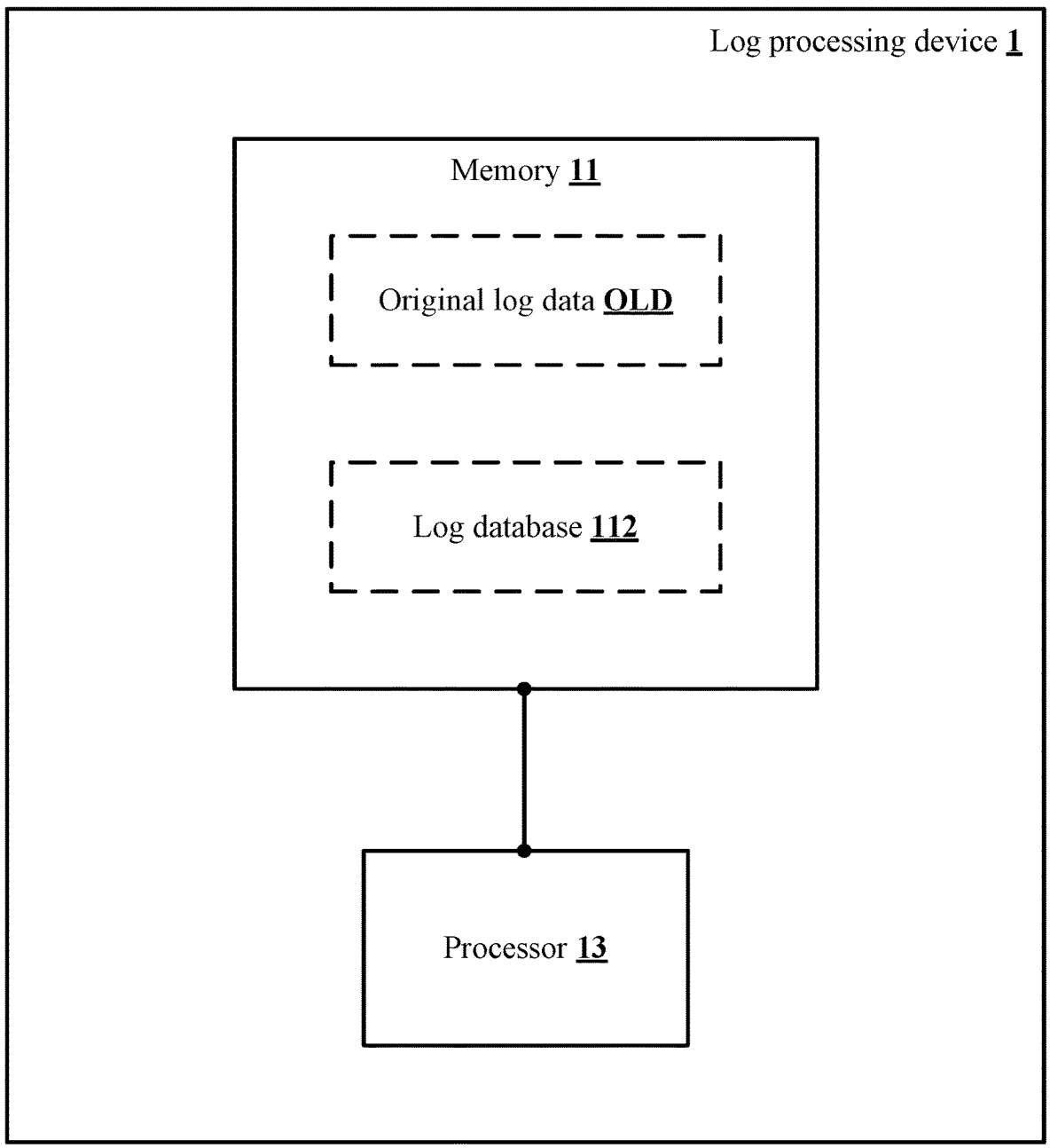
FIG. 6 is a schematic view of a log processing device according to the present disclosure.
Figure 7:
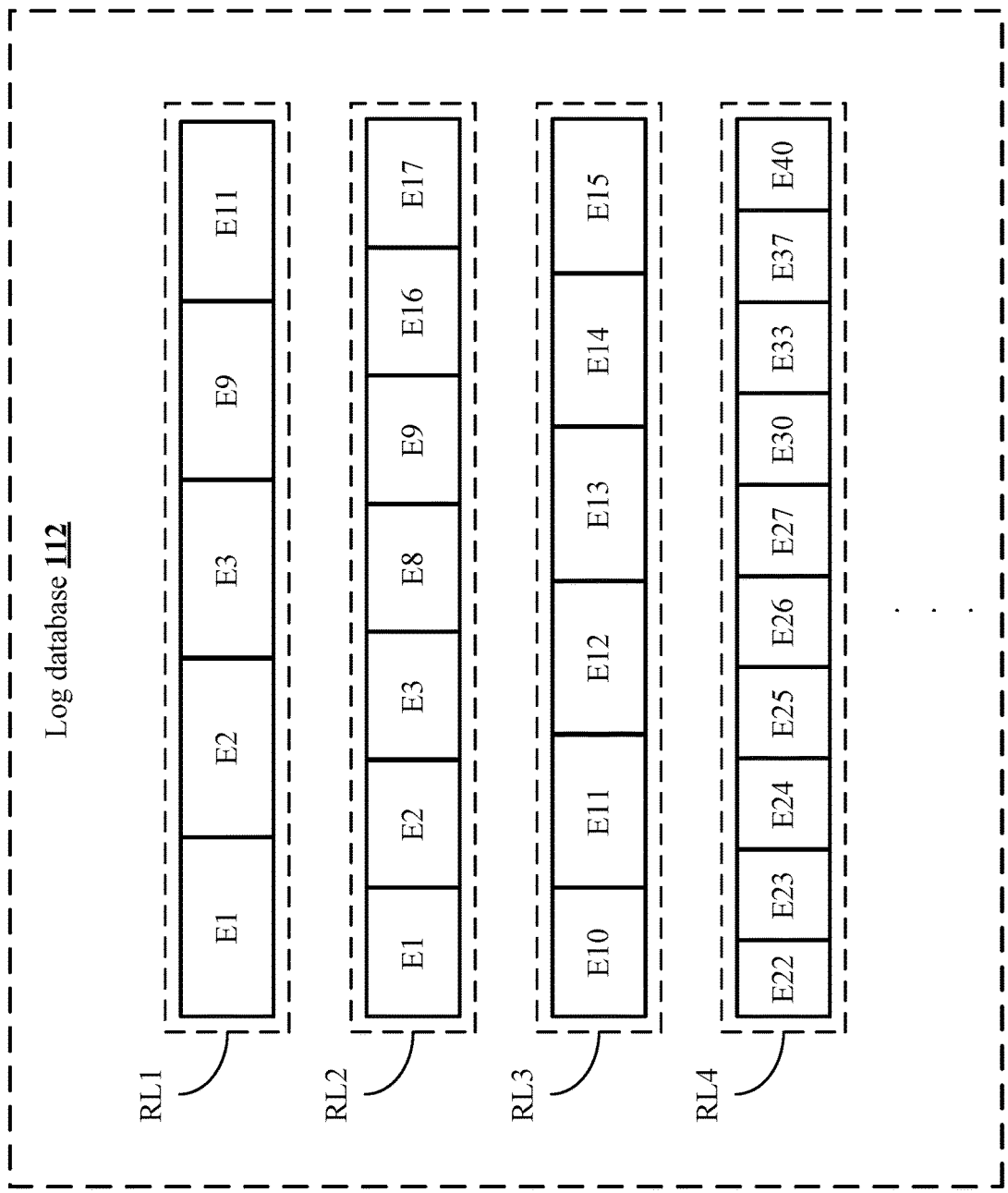
FIG. 7 is a schematic view of a log database according to the present disclosure.
Figure 8:
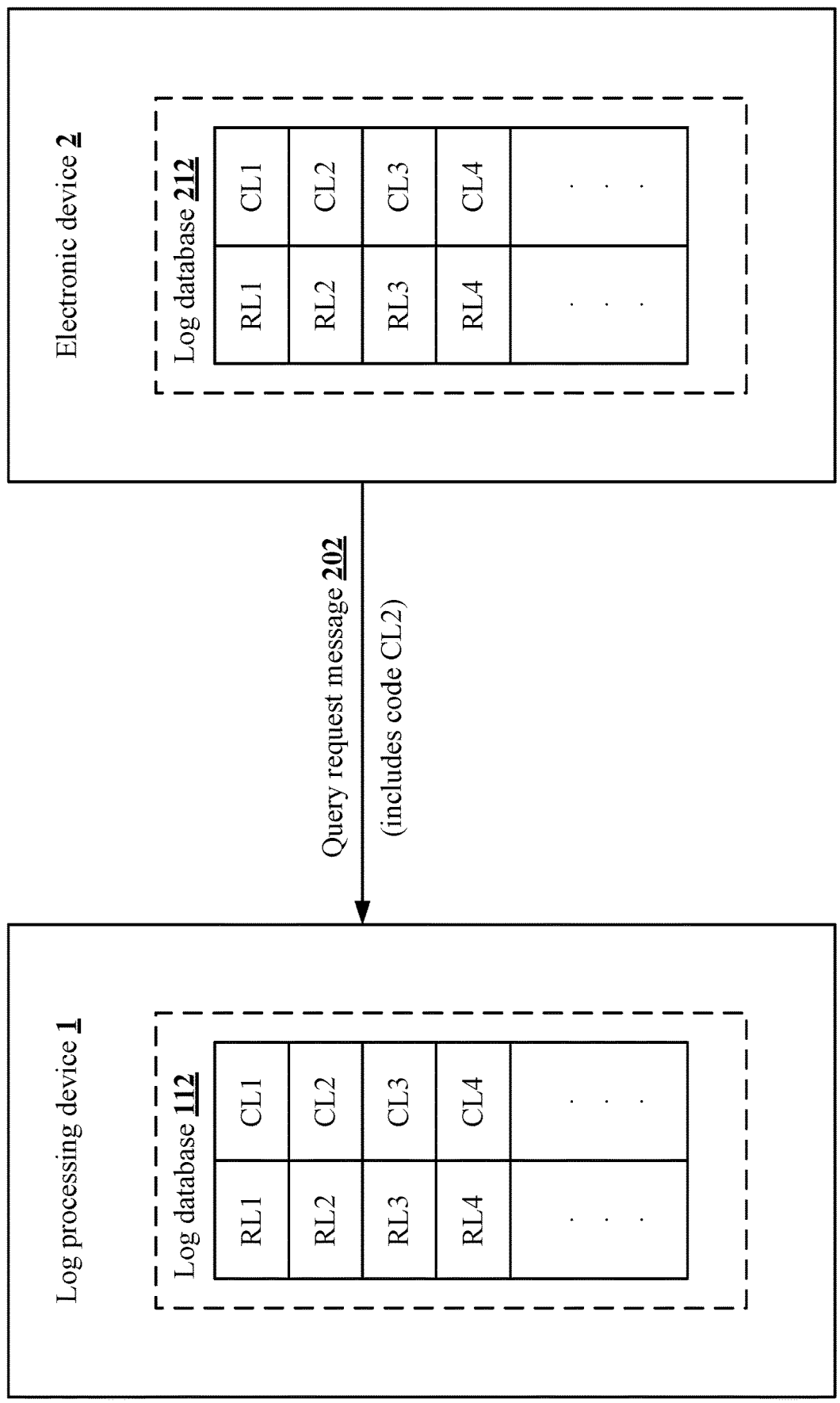
FIG. 8 depicts an implementation scenario of querying a log template according to the present disclosure.

A second embodiment of the present disclosure is as shown in FIG. 6 to FIG. 8. The second embodiment is an extension of the first embodiment. In this embodiment, the memory 11 further stores a log database 112, the log database 112 stores a plurality of recorded log templates RL1~RL4. The recorded log template RL1 includes the event E1, E2, E3, E9, and E11. The recorded log template RL2 includes the event E1, E2, E3, E8, E9, E16, and E17. The recorded log template RL3 includes the event E10, E11, E12, E13, E14, and E15. The recorded log template RL4 includes the event E22, E23, E24, E25, E26, E27, E28, E29, E30, and E40.

To avoid storing repeated log templates in the log database 112, resulting in a waste of storage space, after the processor 13 generates a log template, the processor 13 compares the log template with the recorded log templates RL1~RL4 to determine if the log database 112 already stores a recorded log template the same as the currently generated log template. If there is no recorded log template that is the same as the currently generated log template in the log database 112, the processor 13 stores the log template in the log database 112. Conversely, if there is a recorded log template that is the same as the currently generated log template in the log database 112, the processor 13 does not repeatedly store the log template in the log database 112.

For example, reference is made to FIG. 2 and FIG. 7, the processor 13 compares the log template L1 with the recorded log templates RL1~RL4 to determine if the log database 112 already stores a recorded log template the same as the log template L1. The log template L1 includes the events E1, E2, E3, E4, E5, E6, and E9, and among the recorded log templates RL1~RL4 in the log database 112, there is no recorded log template whose event structure is the same as the log template L1, so the processor 13 stores the log template L1 in the log after the comparison.

For another example, reference is made to FIG. 3 and FIG. 7, the processor 13 compares the log template L2 with the recorded log templates RL1~RL4 to determine if the log database 112 already stores a recorded log template the same as the log template L2. The log template L2 includes the events E10, E11, E12, E13, E14, and E15, and among the recorded log templates RL1~RL4 in the log database 112, there is already a recorded log template RL3 whose event structure is the same as that of the log template L2, so the processor 13 will not store the log template L2 to the log database 112 after the comparison.

For another example, reference is made to FIG. 4 and FIG. 7, the processor 13 compares the log template L3 with the recorded log templates RL1~RL4 to determine if the log database 112 already stores a recorded log template the same as the log template L3. The log template L3 includes the events E22, E23, E24, E25, E26, E27, E28, E29, E30, and E36, and among the recorded log templates RL1~RL4 in the log database 112, although there is a recorded log template RL4 whose event structure is roughly the same as that of the log template L3, the event contained in the recorded log template RL4 is not exactly the same as the log template L3, so the processor 13 still store the log template L3 in the log database 112 after the comparison.

In other embodiments, the processor 13 performs a numbering process on the recorded log templates RL1~RL4 to make each of the recorded log templates RL1~RL4 correspond to a log code. The log processing device 1 receives a query request message from an electronic device 2. When the query request message includes a code of the log codes, the processor 13 retrieves the recorded log template corresponding to the code of the log codes from the log database according to the code, and transmits the recorded log template corresponding to the code to the electronic device 2.

For example, reference is made to FIG. 8, the recorded log template RL1 corresponds to the log code CL1, the recorded log template RL2 corresponds to the log code CL2, the recorded log template RL3 corresponds to the log code CL3, and the recorded log template RL4 corresponds to the log code CL4. The query request message 202 sent by the electronic device 2 contains the code CL2. After receiving the query request message, the log processing device 1 searches its corresponding recorded log template RL2 from the log database 112 according to the code CL2, and transmits the recorded log template RL2 and the events E1, E2, E3, E8, E9, E16, and E17 included in the recorded log template RL2 to the electronic device 2.

In other embodiments, the electronic device 2 stores a log database 212, and the recorded log template stored in the log database 212 is the same as the log database 112. The log database 112 of the electronic device 2 is constantly updated. Therefore, the log database 212 of the electronic device 2 only stores newer (for example, within the past three months) recorded log templates. If the code carried in query request message does not exist in the log database 212 of the electronic device 2, the electronic device 2 transmits the query request message to the log processing device 1 to obtain the recorded log template of the corresponding code.

Figure 9:
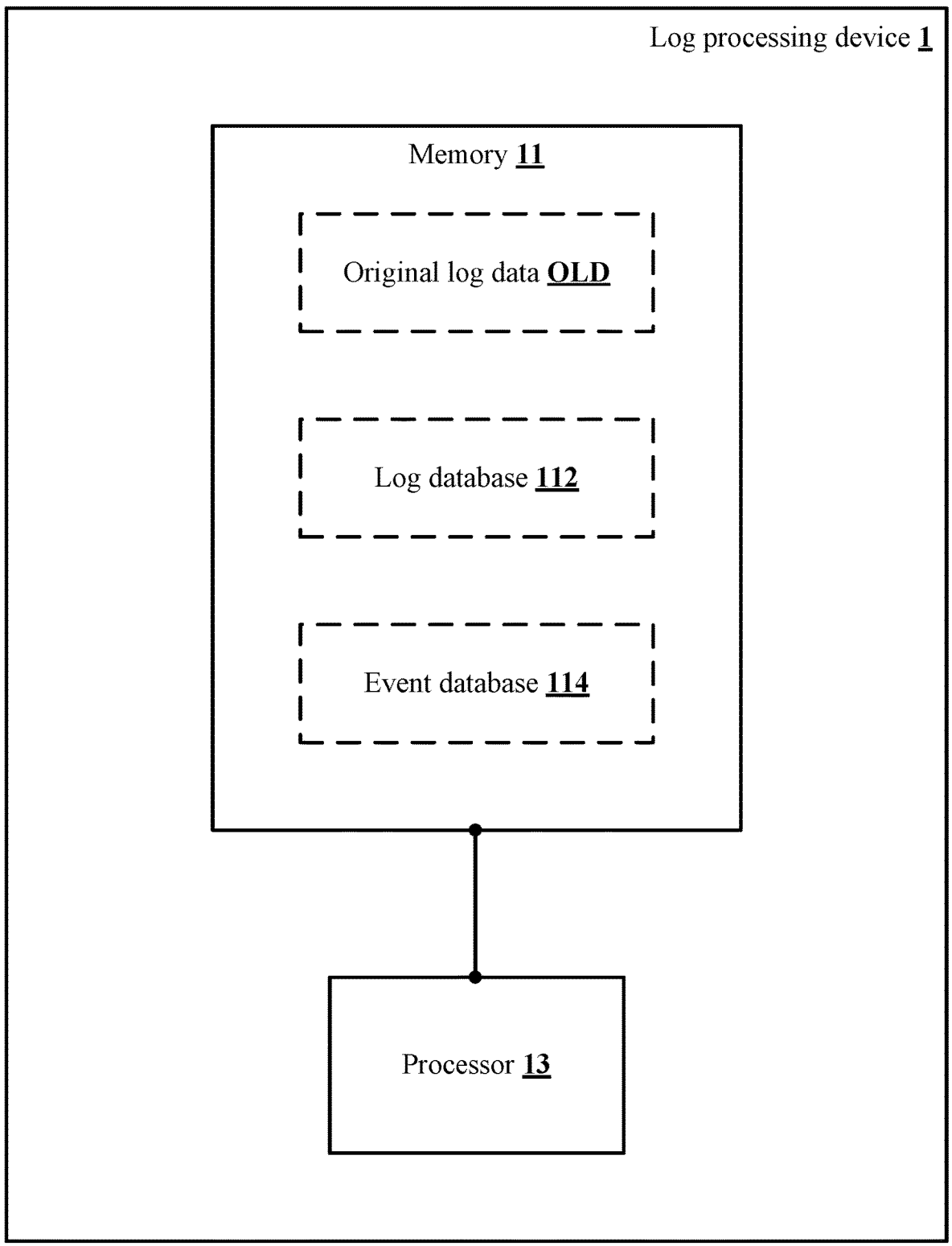
FIG. 9 is a schematic view of a log processing device according to the present disclosure.
Figure 11:
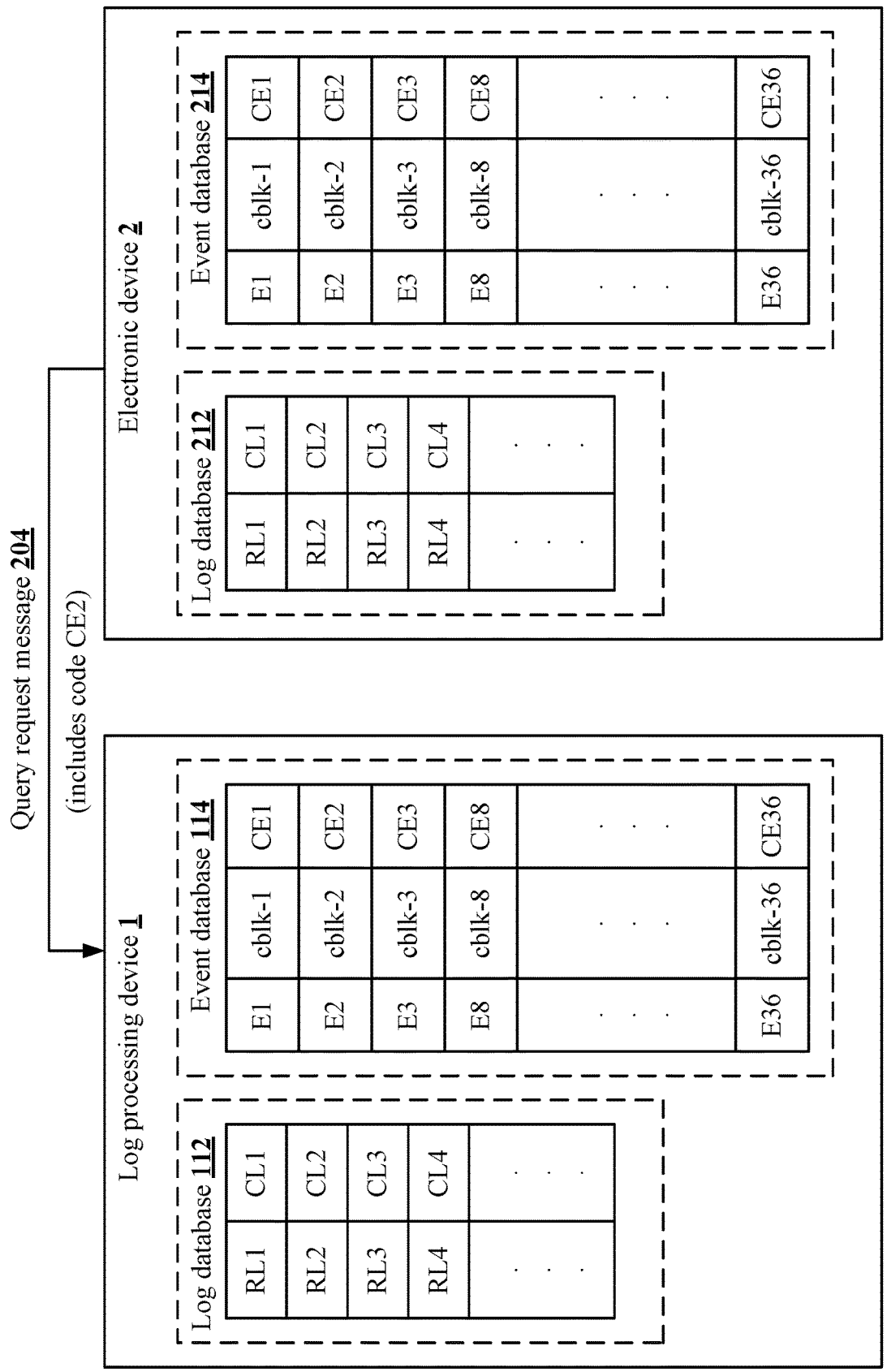
FIG. 11 depicts an implementation scenario of querying an event and a log template according to the present disclosure.

A third embodiment of the present disclosure is as shown in FIG. 9 to FIG. 11. The third embodiment is an extension of the second embodiment. In this embodiment, the memory 11 further stores an event database 114, i.e., the memory 11 stores both of the log database 112 and the event database 114. The event database 114 stores a plurality of recoded events, and the combinational block data corresponding to each of the recorded events, e.g., the event E1 corresponds to the combinational block data cblk-1 "EPOCH", the event E2 corresponds to the combinational block data cblk-2 "level=info", the event E3 corresponds to the combinational block data cblk-3 "ts=YYYY-MM-DDTHH:MM:SS.SSSZ" and so on.

In this embodiment, after the processor 13 of the log processing device 1 generates the log template, the processor 13 needs to store all the events of the log template into the event database 114. To avoid storing repeated events and corresponding combinational block data in the event database 114, resulting in a waste of storage space, the processor 13 compares each of the events with the recorded events after generating the events and storing the events and the combinational block data which corresponds to each of the events to the event database.

If there are no recorded events in the event database 114 that are the same as the events contained in the currently generated log template, the processor 13 stores the events contained in the currently generated log template and the combinational block data which the events correspond to the event database 114. Conversely, if there are recorded events the same as the events of currently generated log template in the event database 114, the processor 13 does not store the repeated events in the event database 114.

For example, reference is made to FIG. 2 and FIG. 10, after generating the log template L1, the processor 13 compares the events of the log template L1 with the recorded events to determine whether there are any events in the event database 114 that are the same as those of the log template L1. The log template L1 includes events E1, E2, E3, E4, E5, E6, and E9, and the event database 114 already stores the recorded E1, E2, and E3. After the comparison, the processor 13 only stores events E4, E5, E6, and E9 and their corresponding combinational block data to the event database 114.

For another example, reference is made to FIG. 3 and FIG. 10, after generating the log template L2, the processor 13 compares the events of the log template L2 with the recorded events to determine whether there are any events in the event database 114 that are the same as those of the log template L2. The log template L2 includes events E10, E11, E12, E13, E14, and E15, and there is no recorded events the same as the events E10, E11, E12, E13, E14, and E15. After the comparison, the processor 13 stores events E10, E11, E12, E13, E14, and E15 and their corresponding combinational block data to the event database 114.

For another example, reference is made to FIG. 4 and FIG. 10, after generating the log template L2, the processor 13 compares the events of the log template L2 with the recorded events to determine whether there are any events in the event database 114 that are the same as those of the log template L2. The log template L2 includes events E10, E11, E12, E13, E14, and E15, and there is no recorded events the same as the events E10, E11, E12, E13, E14, and E15. After the comparison, the processor 13 stores events E10, E11, E12, E13, E14, and E15 and their corresponding combinational block data to the event database 114.

In other embodiments, the processor 13 performs a numbering process on the recorded log templates to make each of the recorded log templates correspond to a log code, and performs the numbering process on the recorded events to make each of the events correspond to an event code. The log processing device 1 receives a query request message from an electronic device 2. When the query request message includes a code of the event codes, the processor 13 retrieves the recorded event corresponding to the code of the event codes from the event database 114 according to the code, and retrieves the recorded log template including the recorded event which corresponds to the code from the log database 112, and transmits the recorded event corresponding to the code and the recorded log template including the recorded event which corresponding to the code to the electronic device 2.

For example, as shown in FIG. 11, the recorded log template RL1 corresponds to the log code CL1, the recorded log template RL2 corresponds to the log code CL2, the recorded log template RL3 corresponds to the log code CL3, and the recorded log template RL4 corresponds to the log code CL4. The electronic device 2 sends the query request message 204 which includes a code CE2 to the log processing device 1. After receiving the query request message 204, the log processing device 1 searches the recorded event E2 corresponding to the code CE2 and the combinational block data cblk-2 corresponding to the event E2 in the event database 114, and transmits the recorded event E2 and the combinational block data cblk-2 to the electronic device 2.

In other embodiments, the log database 212 and the event database 214 in the electronic device 2 are constantly updated. Therefore, the log database 212 of the electronic device 2 only stores newer (e.g., within the past three months) recorded log templates and events. When the code in the query request message does not exist in the event database 214 of the electronic device 2, the electronic device 2 sends the query request message to the log processing device 1 to obtain the corresponding recorded event and the recorded log template including the recorded event.

Figure 12:
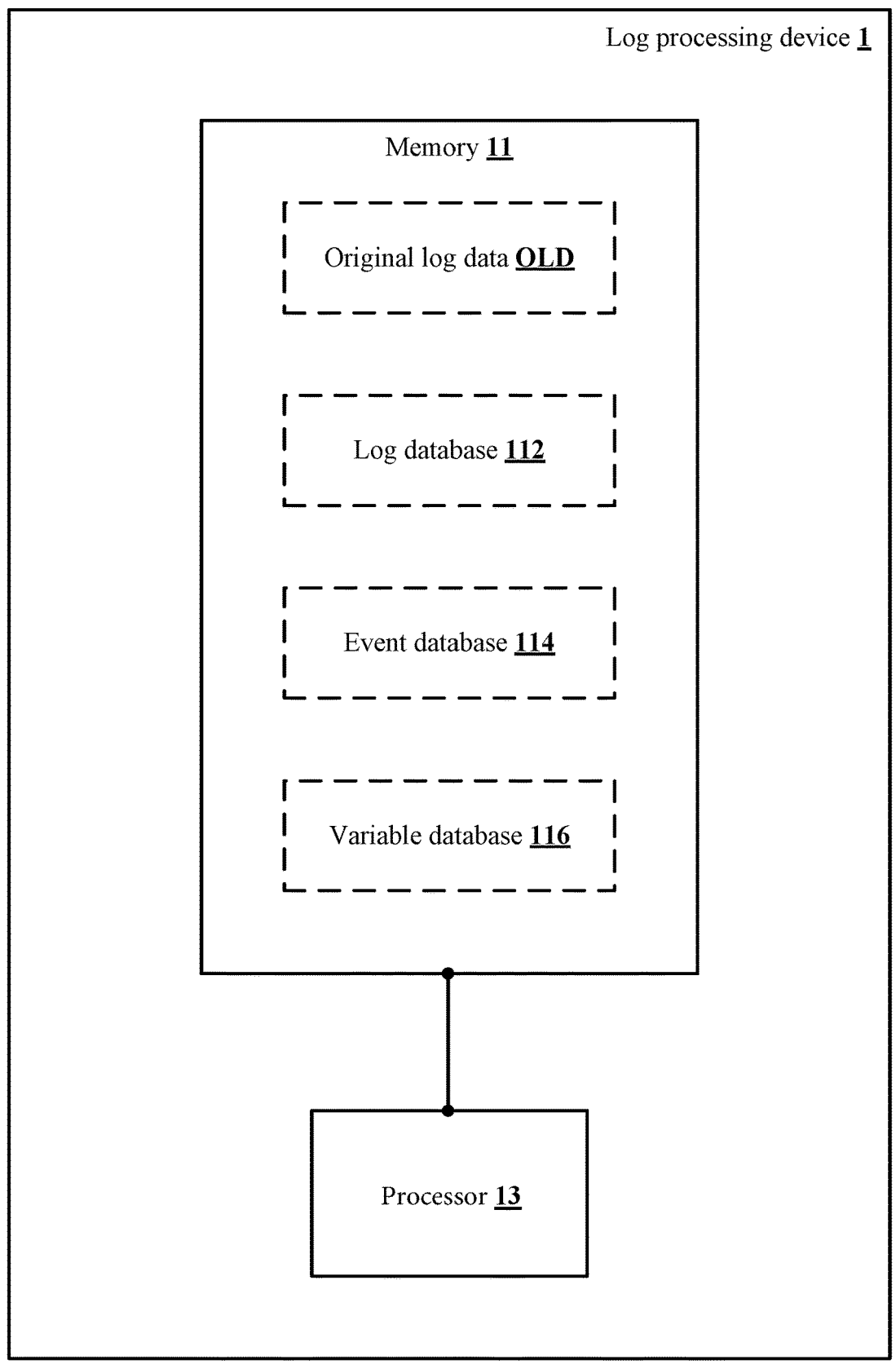
FIG. 12 is a schematic view of a log processing device according to the present disclosure.
Figure 13:
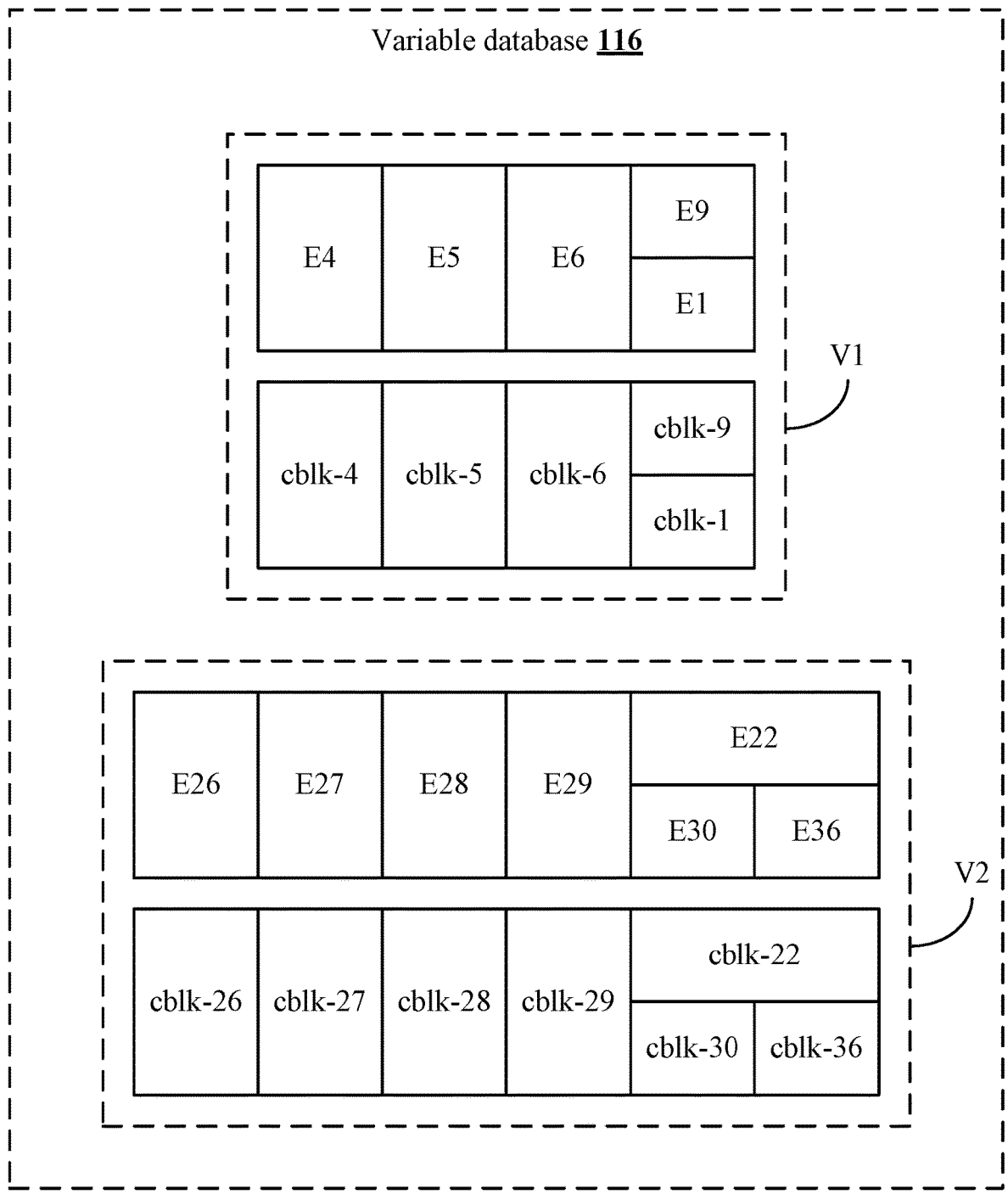
FIG. 13 is a schematic view of a variable database according to the present disclosure.

A fourth embodiment of the present disclosure is as shown in FIG. 12 and FIG. 13. The fourth embodiment is an extension of the third embedment. In this embodiment, the memory 11 is further store a variable database 116, i.e., the memory 11 stores the log database 112, the event database 114, and the variable database 116, as shown in FIG. 12.

The processor 13 of the log processing device 1 determines whether a preset data attribute is included in the combinational block data. If the preset data attribute exists in combinational block data, the processor 13 stores at least one of the events corresponding to the preset data attribute to the variable database 116 according to the preset data attribute. The combinational block data related to the preset data attribute can be used to determine whether the original log data is abnormal, so the default data attributes are usually related to time, such as: execution time, start time, end time, storage file size, storage start location, storage end position, memory start position, memory end position, network packet start position, network packet end position, network transmission rate, network reception rate, etc., but not limited thereto.

For example, reference is made to FIG. 2 and FIG. 13, in the above embodiment, among the data attributes of the combinational block data cblk-1, cblk-2, cblk-3, cblk-4, cblk-5, cblk-6, cblk-9 in the log template L1, the data attribute of the combinational block data cblk-9 is execution time which belongs to the preset data attribute. However, if only storing the combinational block data cblk-9 into the variable database 116, the combinational block data cblk-9 cannot be used to identify abnormalities. Therefore, it is necessary to store the combinational block data cblk-4, cblk-5, cblk-6 which are related to the execution time of the combinational block data cblk-9. Each of the events E4, E5, E6, and E9 corresponding to the combinational block data cblk-4, cblk-5, cblk-6, and cblk-9 form the variable template V1. The variable template V1 records the combinational block data cblk-4, cblk-5, cblk-6, cblk-9 corresponding to the events E4, E5, E6, and E9 respectively.

For example, reference is made to FIG. 3 and FIG. 13, in the above embodiment, there is no preset data attribute among the data attributes of the combinational block data in the log template L2. Therefore, the log template L2 does not include any variable template. In other words, not all the log template exists a variable template.

For example, reference is made to FIG. 5 and FIG. 13, in the above embodiment, among the data attributes of the combinational block data cblk-22, cblk-23, cblk-24, cblk-25, cblk-26, cblk-27, cblk-28, cblk-29, cblk-30, cblk-36 in the log template L3, the data attribute of the combinational block data cblk-30 is execution time which belongs to the preset data attribute, and the data attribute of the combinational block data cblk-36 is execution time which also belongs to the preset data attribute. Therefore, the processor 13 needs to store the combinational block data cblk-30, the combinational block data cblk-36, and their related combinational block data cblk-22, cblk-23, cblk-24, cblk-24, cblk-26, cblk-27, cblk-28, cblk-29 to the variable database 116.

The events E22, E23, E24, E25, E26, E27, E28, E29, E30, and E36, corresponds to the combinational block data cblk-22, cblk-23, cblk-24, cblk-25, cblk-26, cblk-27, cblk-28, cblk-29, cblk-30, and cblk-36 respectively, constitute a variable template V2. The variable template V2 records the events E22, E23, E24, E25, E26, E27, E28, E29, E30, and E36.

Figure 14:
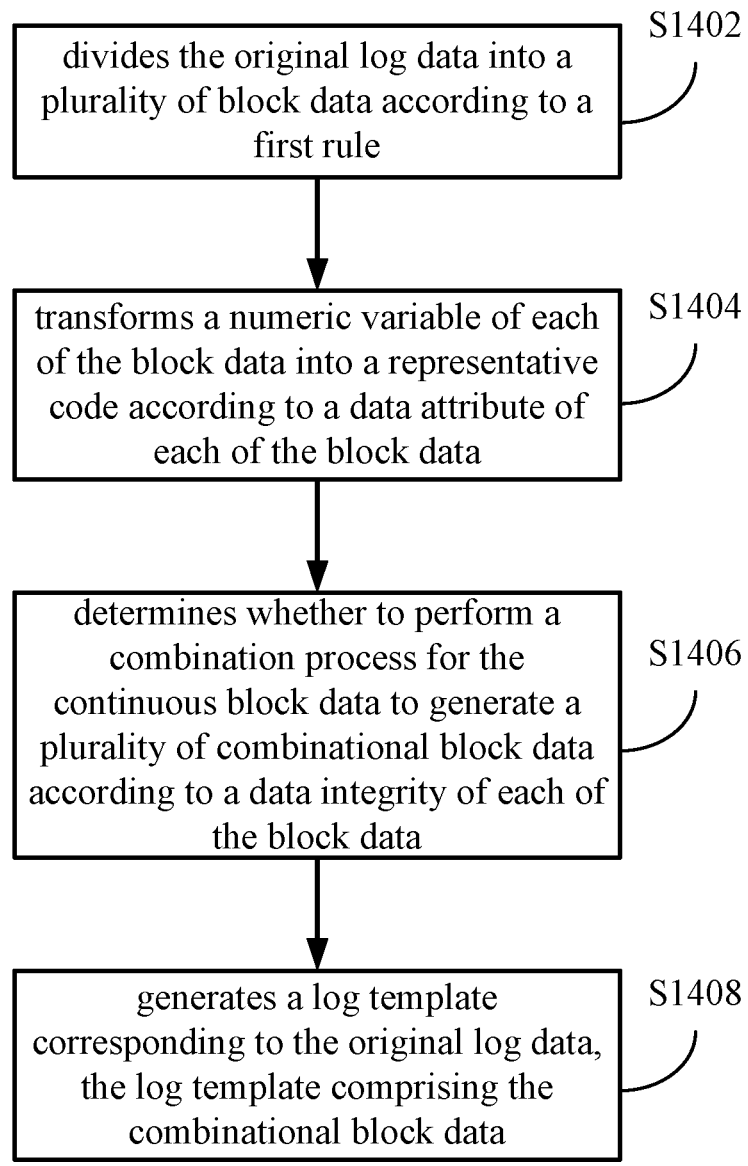
FIG. 14 is flowchart diagram of a log processing method according to the present disclosure.

A fifth embodiment of the present invention describes a log processing method, and a flowchart diagram thereof is as shown in FIG. 14. A log processing method is use in a log processing device (e.g., the log processing 1 described in the aforesaid embodiments). The log processing device includes a memory and a processor. The processor is electrically connected to the memory. The memory stores an original log data. The log processing method is executed by the processor and includes the steps as follows.

First, in step S1402, divides the original log data into a plurality of block data according to a first rule. In one embodiment, the original log data includes of a plurality of strings, the processor takes a blank between each of the strings as the first rule to divide the original log data into the combinational block data.

In step S1404, transforms a numeric variable of each of the block data into a representative code according to a data attribute of each of the block data. In step S1406, determines whether to perform a combination process for the continuous block data to generate a plurality of combinational block data according to a data integrity of each of the block data. In step S1408, generates a log template corresponding to the original log data, the log template comprising the combinational block data. Each of the combinational block data corresponds to an event.

In other embodiments, the combination process determines a data integrity of each of the block data according to a second rule. When the data integrity of the at least two of the continuous block data are less than a threshold, combines at least two of the continuous block data. When the data integrity of one of the at least two of the continuous block data is less than the threshold, and the data integrity of the other one of the at least two of the continuous block data is greater than the threshold, the processor does not combine the at least two of the continuous block data. In one embodiment, the second rule is a semantic analysis.

In other embodiments, the memory further stores a log database. The log database stores a plurality of recorded log templates. The log processing method further includes the steps of: compares the log template with the recorded log templates after generating the log template and stores the log template to the log database.

In addition, in other embodiments, the memory further stores a log database. The log database stores a plurality of recorded log templates. The log processing method further includes the steps of: performs a numbering process on the recorded log templates to make each of the recorded log templates correspond to a log code, and receives a query request message from an electronic device. When the query request message includes a code of the log codes, retrieves the recorded log template corresponding to the code of the log codes from the log database according to the code, and transmits the recorded log template corresponding to the code to the electronic device.

In other embodiments, except for the log database, the memory stores an event database, and the event database stores a plurality of recoded events. The log processing method further includes the following step of: compares each of the events with the recorded events after generating the events and stores the events and the combinational block data which corresponds to each of the events to the event database.

In addition, in other embodiments, the log processing method further includes the following step of: performs a numbering process on the recorded log templates to make each of the recorded log templates correspond to a log code, performs the numbering process on the recorded events to make each of the events correspond to an event code, and receives a query request message from an electronic device.

In other embodiments, except for the log database and the event database, the memory further stores a variable database and the log processing method further comprises the following steps of: determines whether a preset data attribute is included in the combinational block data, and stores at least one of the events corresponding to the preset data attribute to the variable database according to the preset data attribute.

In addition to the aforesaid steps, the log processing method of the present disclosure can also execute all the operations described in the aforesaid embodiments and have all the corresponding functions, and how this embodiment executes these operations and has these functions based on the aforesaid embodiments shall be readily appreciated by those of ordinary skill in the art, and thus will not be further described herein.

According to the above description, the log data parsing mechanism of the present disclosure extract the events that caused the log record and analyze the variable changes, and the method for analyzing the original log data of the present invention does not need to be changed due to the original log data of different data types. Accordingly, the log record analysis mechanism of the present disclosure can satisfy the analysis of various complex log contents, and store the corresponding data through different database after the analysis, so that the user can quickly identify the original log data. In addition, through using the block data processing, not only the computing performance can be improved, but also the horizontal scalability can be obtained.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A log processing device, comprising:
a memory, being configured to store an original log data; and
a processor, being electrically connected to the memory, and configured to perform operations comprising:
dividing the original log data into a plurality of block data according to a first rule;
transforming a numeric variable of each of the block data into a representative code according to a data attribute of each of the block data;
determining whether to perform a combination process for a continuous block data to generate a plurality of combinational block data according to a data integrity of each of the block data, wherein when the processor performs the combination process, the processor is further configured to perform operations comprising:
determining, in order, a data integrity of each of the block data according to a second rule; and
combining at least two of the continuous block data when the data integrity of the at least two of the continuous block data are less than a threshold; and
generating a log template corresponding to the original log data for log processing, the log template comprising the combinational block data, wherein the log template is configured to record an event corresponding to each of the combinational block data corresponding to the original log data, and the processor is further configured to determine whether to store the event corresponding to each of the combinational block data into an event database based on the log template;
wherein each of the combinational block data corresponds to an event.

2. The log processing device of claim 1, wherein the original log data comprises a plurality of strings, the processor is configured to take a blank between each of the strings as the first rule to divide the original log data into the combinational block data.

3. The log processing device of claim 1, wherein the processor is further configured to perform operation comprising:
when the data integrity of one of the at least two of the continuous block data is less than the threshold, and the data integrity of the other one of the at least two of the continuous block data is greater than the threshold, the processor does not combine the at least two of the continuous block data.

4. The log processing device of claim 1, wherein the second rule is a semantic analysis.

5. The log processing device of claim 1, wherein the memory is further configured to store a log database, the log database stores a plurality of recorded log templates, and the processor is further configured to perform operation comprising:
comparing the log template with the recorded log templates after generating the log template and storing the log template to the log database.

6. The log processing device of claim 5, wherein the processor is further configured to perform operations comprising:
performing a numbering process on the recorded log templates to make each of the recorded log templates correspond to a log code;
receiving a query request message from an electronic device; and
when the query request message comprising a code of the log codes, retrieving the recorded log template corresponding to the code of the log codes from the log database according to the code, and transmitting the recorded log template corresponding to the code to the electronic device.

7. The log processing device of claim 5, wherein the memory is further configured to store an event database, the event database stores a plurality of recoded events, and the processor is further configured to perform operation comprising:
comparing each of the events with the recorded events after generating the events and storing the events and the combinational block data which corresponds to each of the events to the event database.

8. The log processing device of claim 7, wherein the processor is further configured to perform operation comprising:
   performing a numbering process on the recorded log templates to make each of the recorded log templates correspond to a log code;
   performing the numbering process on the recorded events to make each of the recorded events correspond to an event code;
   receiving a query request message from an electronic device; and
   when the query request message comprising a code of the event codes, retrieving the recorded event corresponding to the code of the event codes from the event database according to the code, retrieving the recorded log template including the recorded event which corresponds to the code from the log database, and transmitting the recorded event corresponding to the code and the recorded log template including the recorded event which corresponding to the code to the electronic device.

9. The log processing device of claim 7, wherein the memory is further configured to store a variable database, and the processor is further configured to perform operation comprising:
   determining whether a preset data attribute is included in the combinational block data; and
   storing at least one of the events corresponding to the preset data attribute to the variable database according to the preset data attribute.

10. A log processing method for a log processing device, the log processing device comprising a memory and a processor, the memory being configured to store an original log data, the log processing method being executed by the processor and comprising:
   dividing the original log data into a plurality of block data according to a first rule;
   transforming a numeric variable of each of the block data into a representative code according to a data attribute of each of the block data;
   determining whether to perform a combination process for a continuous block data to generate a plurality of combinational block data according to a data integrity of each of the block data, wherein when the processor is configured to perform the combination process, the log processing method further comprises:
      determining, in order, a data integrity of each of the block data according to a second rule; and
      combining at least two of the continuous block data when the data integrity of the at least two of the continuous block data are less than a threshold; and
   generating a log template corresponding to the original log data for log processing, the log template comprising the combinational block data, wherein the log template is configured to record an event corresponding to each of the combinational block data corresponding to the original log data, and the processor is further configured to determine whether to store the event corresponding to each of the combinational block data into an event database based on the log template;
   wherein each of the combinational block data corresponds to an event.

11. The log processing method of claim 10, wherein the original log data comprises a plurality of strings, the processor is configured to take a blank between each of the strings as the first rule to divide the original log data into the combinational block data.

12. The log processing method of claim 10, further comprising:
   when the data integrity of one of the at least two of the continuous block data is less than the threshold, and the data integrity of the other one of the at least two of the continuous block data is greater than the threshold, the processor does not combine the at least two of the continuous block data.

13. The log processing method of claim 10, wherein the second rule is a semantic analysis.

14. The log processing method of claim 10, wherein the memory is further configured to store a log database, the log database stores a plurality of recorded log templates, and the log processing method further comprises:
   comparing the log template with the recorded log templates after generating the log template and storing the log template to the log database.

15. The log processing method of claim 14, further comprising:
   performing a numbering process on the recorded log templates to make each of the recorded log templates correspond to a log code;
   receiving a query request message from an electronic device; and
   when the query request message comprising a code of the log codes, retrieving the recorded log template corresponding to the code of the log codes from the log database according to the code, and transmitting the recorded log template corresponding to the code to the electronic device.

16. The log processing method of claim 14, wherein the memory is further configured to store an event database, the event database stores a plurality of recoded events, and the log processing method further comprises:
   comparing each of the events with the recorded events after generating the events and storing the events and the combinational block data which corresponds to each of the events to the event database.

17. The log processing method of claim 16, further comprising:
   performing a numbering process on the recorded log templates to make each of the recorded log templates correspond to a log code;
   performing the numbering process on the recorded events to make each of the recorded events correspond to an event code;
   receiving a query request message from an electronic device; and
   when the query request message comprising a code of the event codes, retrieving the recorded event corresponding to the code of the event codes from the event database according to the code, retrieving the recorded log template including the recorded event which corresponds to the code from the log database, and transmitting the recorded event corresponding to the code and the recorded log template including the recorded event which corresponding to the code to the electronic device.

18. The log processing method of claim 17, wherein the memory is further configured to store a variable database, and the log processing method further comprises:
   determining whether a preset data attribute is included in the combinational block data; and
   storing at least one of the events corresponding to the preset data attribute to the variable database according to the preset data attribute.

* * * * *